(12) United States Patent
Bekku

(10) Patent No.: US 11,693,076 B2
(45) Date of Patent: Jul. 4, 2023

(54) INFORMATION PROCESSING APPARATUS, INFORMATION PROCESSING METHOD, AND NON-TRANSITORY COMPUTER-READABLE STORAGE MEDIUM STORING INFORMATION PROCESSING PROGRAM

(71) Applicant: CANON MEDICAL SYSTEMS CORPORATION, Otawara (JP)

(72) Inventor: Mitsuhiro Bekku, Utsunomiya (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 17/450,174

(22) Filed: Oct. 7, 2021

(65) Prior Publication Data

US 2022/0120835 A1   Apr. 21, 2022

(30) Foreign Application Priority Data

Oct. 20, 2020 (JP) .............................. JP2020-176316

(51) Int. Cl.
| | | |
|---|---|---|
| G01V 3/00 | (2006.01) | |
| G01R 33/561 | (2006.01) | |
| G01R 33/54 | (2006.01) | |
| G01R 33/565 | (2006.01) | |

(52) U.S. Cl.
CPC ........ G01R 33/5611 (2013.01); G01R 33/543 (2013.01); G01R 33/56545 (2013.01)

(58) Field of Classification Search
CPC .............. G01R 33/3415; G01R 33/543; G01R 33/5659; G01R 33/36; A61B 5/055

USPC .......................................................... 324/309
See application file for complete search history.

(56) References Cited

U.S. PATENT DOCUMENTS

| | | | | |
|---|---|---|---|---|
| 2009/0093709 A1* | 4/2009 | Patel | .................. | G01R 33/5611 |
| | | | | 600/411 |
| 2017/0261582 A1* | 9/2017 | Blasche | .......... | G01R 33/56341 |
| 2018/0276822 A1* | 9/2018 | Liu | ........................ | A61B 5/721 |
| 2019/0378270 A1 | 12/2019 | Ida et al. | | |

FOREIGN PATENT DOCUMENTS

| | | | | |
|---|---|---|---|---|
| CN | 108957375 A | * | 12/2018 | ............. A61B 5/055 |
| JP | 2019-208990 A | | 12/2019 | |

\* cited by examiner

*Primary Examiner* — Walter L Lindsay, Jr.
*Assistant Examiner* — Frederick WEnderoth
(74) *Attorney, Agent, or Firm* — Oblon, McClelland, Maier & Neustadt, L.L.P.

(57) ABSTRACT

An information processing apparatus according to an embodiment of the present disclosure includes a processing circuitry. The processing circuitry obtains a first g factor generated by using first magnetic resonance data acquired through a first parallel imaging process performed by using a plurality of reception coils and a second g factor generated by using second magnetic resonance data related to a second parallel imaging process performed by using the plurality of reception coils. The second parallel imaging process is different from the first parallel imaging process. The processing circuitry adjusts the first g factor so as to reduce a difference between the first g factor and the second g factor.

11 Claims, 17 Drawing Sheets

FIG.14
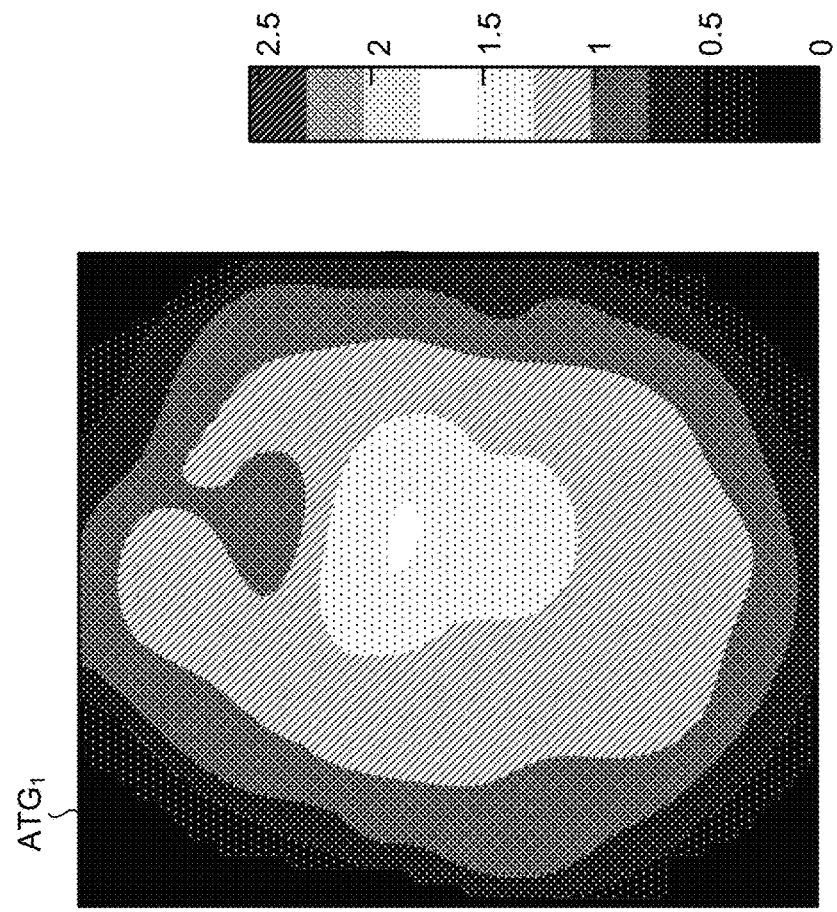
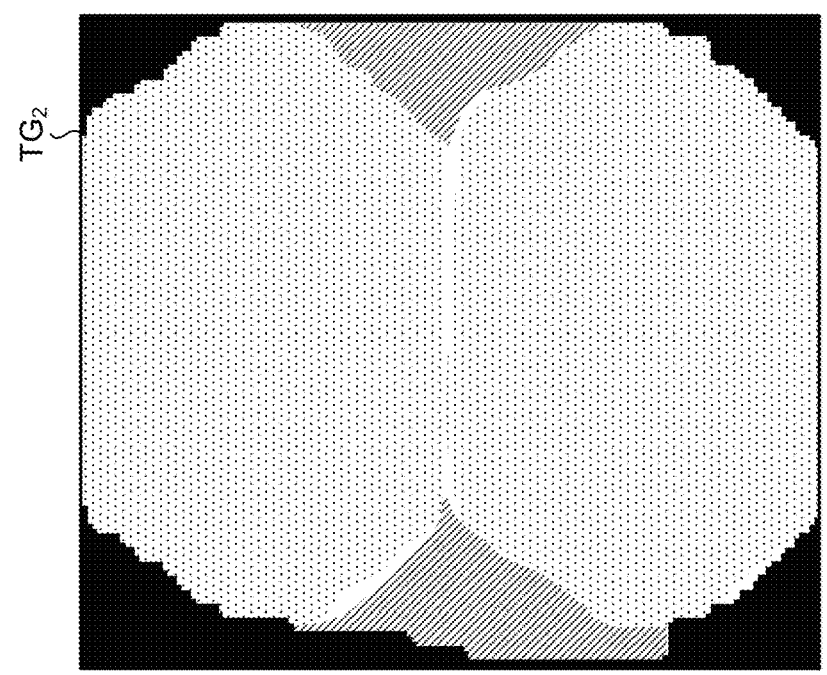

INFORMATION PROCESSING APPARATUS, INFORMATION PROCESSING METHOD, AND NON-TRANSITORY COMPUTER-READABLE STORAGE MEDIUM STORING INFORMATION PROCESSING PROGRAM

CROSS-REFERENCE TO RELATED APPLICATIONS

This application is based upon and claims the benefit of priority from Japanese Patent Application No. 2020-176316, filed on Oct. 20, 2020; the entire contents of which are incorporated herein by reference.

FIELD

Embodiments described herein relate generally to an information processing apparatus, an information processing method, and a non-transitory computer-readable storage medium storing an information processing program.

BACKGROUND

Conventionally, Magnetic Resonance Imaging (hereinafter, "MRI") apparatuses may be used, in some situations, for generating an MR image by imaging an examined subject while using a method involving parallel imaging. On such occasion, depending on the method of the parallel imaging, even though artifacts may successfully be reduced, the generated MR image may have a low Signal-to-Noise Ratio (SNR) due to values of a g factor being large, the g factor indicating the degree of amplification of noise components in unfolding processes.

BRIEF DESCRIPTION OF THE DRAWINGS

FIG. 14 is a drawing according to the embodiment illustrating a second overall g map and a first overall g map after the g factor adjusting process;

DETAILED DESCRIPTION

Figure 1:
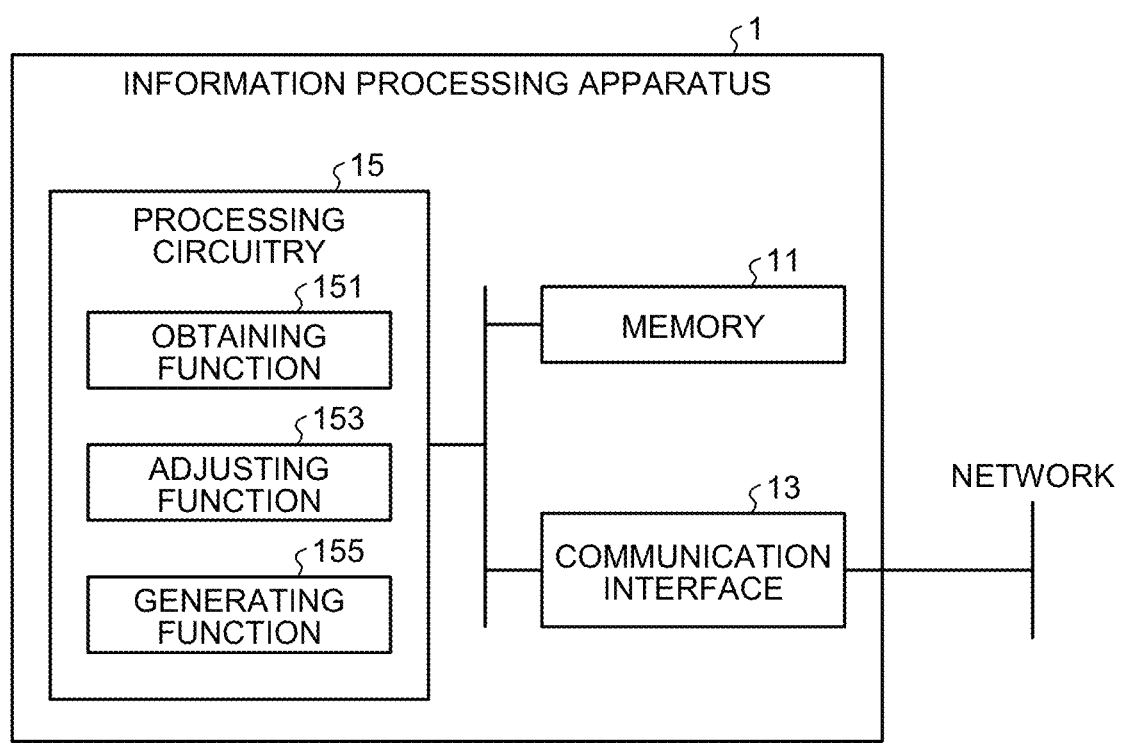
FIG. 1 is a block diagram illustrating an example of an information processing apparatus according to an embodiment.

Exemplary embodiments of an information processing apparatus, an information processing method, and an information processing program will be explained in detail below, with reference to the accompanying drawings. FIG. 1 is a block diagram illustrating an example of an information processing apparatus 1. For example, the information processing apparatus 1 may be installed in a modality equipped with various types of functions of the information processing apparatus 1 or a server used in a hospital or the like. Alternatively, the various types of functions of the information processing apparatus 1 may be provided in a server included in a medical image management system (hereinafter, "Picture Archiving and Communication System [PACS]"), a server included in a Hospital Information System (hereinafter, "HIS"), or a server related to a cloud provided in a network.

Further, the modality denotes, for example, a medical image diagnosis apparatus related to MRI such as a Magnetic Resonance Imaging (hereinafter, "MRI") apparatus, a Positron Emission Tomography (PET)-MRI apparatus, or a Single Photon Emission Computed Tomography (SPECT)-MRI apparatus. In the following sections, to explain specific examples, it is assumed that the information processing apparatus 1 is installed in an MRI apparatus. In that situation, the MRI apparatus has the various types of functions included in processing circuitry 15.

EMBODIMENTS

Figure 2:
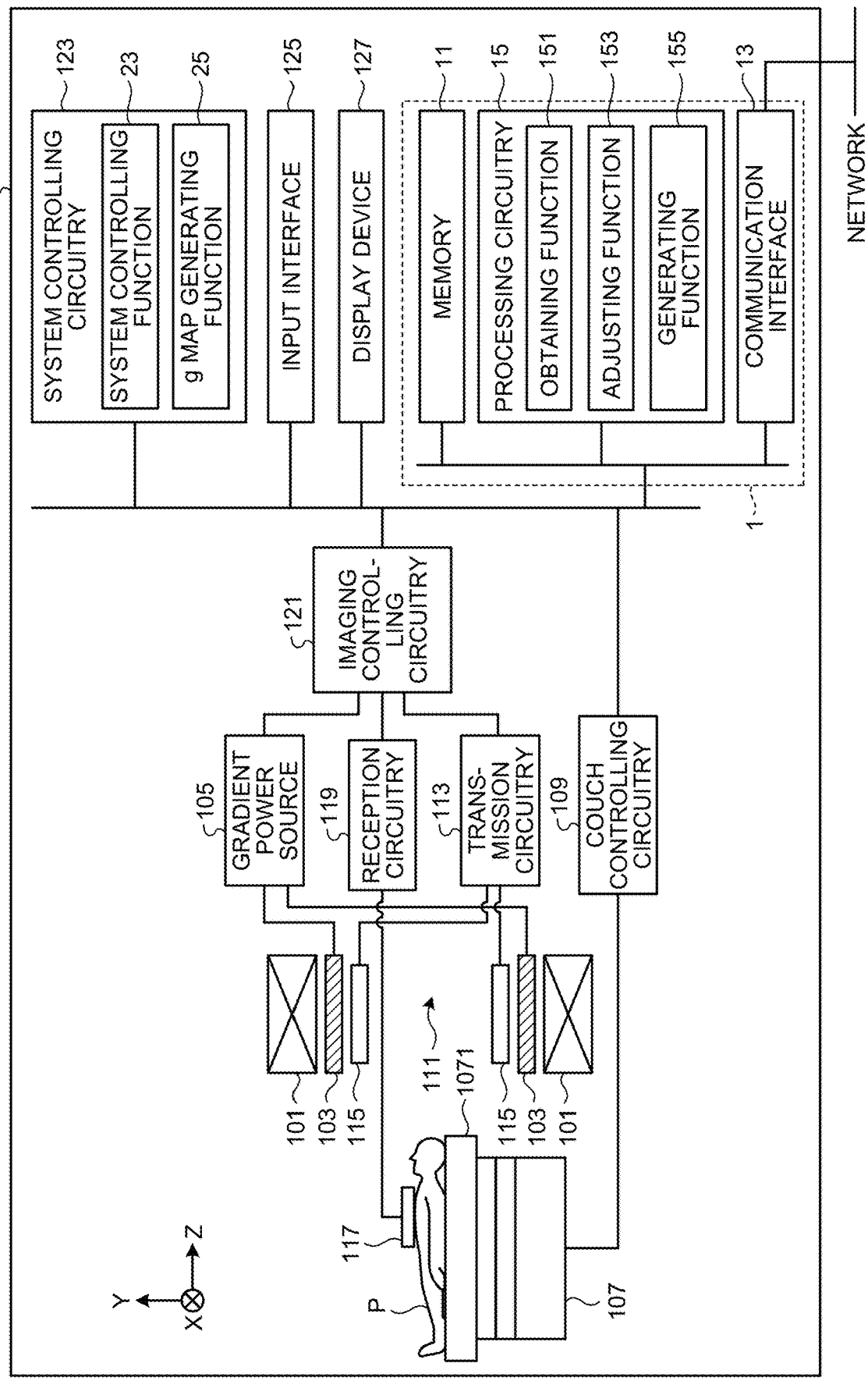
FIG. 2 is a block diagram illustrating an example of a magnetic resonance imaging apparatus according to the embodiment.

FIG. 2 is a diagram illustrating an example of an MRI apparatus 100 according to an embodiment of the present disclosure. As illustrated in FIG. 2, the MRI apparatus 100 includes: a static magnetic field magnet 101, a gradient coil 103, a gradient power source 105, a couch 107, couch controlling circuitry 109, transmission circuitry 113, a transmission coil 115, a reception coil array 117, reception circuitry 119, imaging controlling circuitry (an imaging controlling unit) 121, system controlling circuitry (a system controlling unit) 123, a memory 11, an input interface 125, a display device 127, a communication interface 13, and the processing circuitry 15. Also, in addition to the memory 11, the communication interface 13, and the processing circuitry 15, the information processing apparatus 1 may further include the input interface 125 and the display device 127.

The static magnetic field magnet 101 is a magnet formed to have a hollow and substantially circular cylindrical shape. The static magnetic field magnet 101 is configured to generate a substantially uniform static magnetic field in the space on the inside thereof. For example, a superconductive magnet or the like may be used as the static magnetic field magnet 101.

The gradient coil 103 is a coil formed to have a hollow and substantially circular cylindrical shape and is arranged on the inner surface side of a cooling container having a circular cylindrical shape. By individually receiving a supply of an electric current from the gradient power source 105, the gradient coil 103 is configured to generate gradient magnetic fields of each of which the magnetic field intensity changes along X-, Y-, and Z-axes that are orthogonal to one another. For example, the gradient magnetic fields generated by the gradient coil 103 along the X-, Y-, and Z-axes form a slice selecting gradient magnetic field, a phase encoding gradient magnetic field, and a frequency encoding gradient magnetic field. The slice selecting gradient magnetic field is used for arbitrarily determining an imaged cross-sectional plane. The phase encoding gradient magnetic field is used for changing the phase of a magnetic resonance signal (hereinafter, "MR signal") in accordance with a spatial position. The frequency encoding gradient magnetic field is used for changing the frequency of an MR signal in accordance with a spatial position.

The gradient power source 105 is a power source device configured to supply the electric currents to the gradient coil 103, under control of the imaging controlling circuitry 121.

The couch 107 is a device including a couchtop 1071 on which an examined subject (hereinafter, "patient") P is placed. Under control of the couch controlling circuitry 109, the couch 107 is configured to insert the couchtop 1071 on which the patient P is placed, into a bore 111.

The couch controlling circuitry 109 is circuitry configured to control the couch 107. By driving the couch 107 according to an instruction from an operator received via an input interface 125, the couch controlling circuitry 109 is configured to move the couchtop 1071 in longitudinal directions and up-and-down directions, as well as left-and-right directions in some situations.

The transmission circuitry 113 is configured to supply a radio frequency pulse modulated with a Larmor frequency to the transmission coil 115, under control of the imaging controlling circuitry 121. For example, the transmission circuitry 113 includes an oscillating unit, a phase selecting unit, a frequency converting unit, an amplitude modulating unit, a Radio Frequency (RF) amplifier, and the like. The oscillating unit is configured to generate an RF pulse having a resonance frequency unique to a target atomic nucleus positioned in the static magnetic field. The phase selecting unit is configured to select a phase of the RF pulse generated by the oscillating unit. The frequency converting unit is configured to convert the frequency of the RF pulse output from the phase selecting unit. The amplitude modulating unit is configured to modulate the amplitude of the RF pulse output from the frequency converting unit according to a sinc mathematical function, for example. The RF amplifier is configured to amplify the RF pulse output from the amplitude modulating unit and to supply the amplified RF pulse to the transmission coil 115.

The transmission coil 115 is a Radio Frequency (RF) coil arranged on the inside of the gradient coil 103. The transmission coil 115 is configured to generate an RF pulse corresponding to a radio frequency magnetic field, in accordance with the output from the transmission circuitry 113.

The reception coil array 117 is arranged on the inside of the gradient coil 103. For example, the reception coil array 117 is a coil array including one or more, typically two or more, reception coils (which may be called "coil elements"). Also, the reception coil array 117 may further include a whole body coil (hereinafter, "WB coil"). The reception coil array 117 is configured to receive an MR signal emitted from the patient P due to influence of the radio frequency magnetic field. Upon receipt of the MR signal, the reception coil array 117 is configured to output the received MR signal to the reception circuitry 119. Further, although FIG. 2 depicts the transmission coil 115 and the reception coil array 117 separately, the transmission coil 115 and the reception coil array 117 may be implemented as an integrally-formed transmission/reception coil device. The transmission/reception coil device corresponds to an imaged site of the patient P and may be, for example, a local transmission/reception RF coil such as a head coil.

On the basis of the MR signal output from the reception coil array 117, the reception circuitry 119 is configured to generate a digital MR signal (hereinafter, "MR data"). More specifically, the reception circuitry 119 generates the MR data by performing signal processing processes such as wave detection, filtering, and the like on the MR signal output from the reception coil array 117 and subsequently performing an Analog-to-Digital conversion (hereinafter, "A/D conversion") on the data resulting from the signal processing processes. The reception circuitry 119 is configured to output the generated MR data to the imaging controlling circuitry 121 (which may be called sequence controlling circuitry). For example, the MR data is generated with respect to each of the reception coils and is output to the imaging controlling circuitry 121 together with a tag identifying each reception coil. Alternatively, the reception circuitry 119 may be provided on the side of a gantry device (which may be called "gantry") including the static magnetic field magnet 101 and the gradient coil 103.

In an example, the MR signals output from the reception coils in the reception coil array 117 may be output to the reception circuitry 119 in units called channels or the like, as a result of being separated or combined as appropriate. In that situation, the MR data is handled in correspondence with the channels in the processes at the stages subsequent to the reception circuitry 119. As for the relationship between the total quantity of the reception coils and the total quantity of the channels, the quantities may be equal, but the total quantity of the channels may be smaller than the total quantity of the reception coils, or the total quantity of the channels may be larger than the total quantity of the reception coils. In the following sections, when the expression "with respect to each of the reception coils" is used, the process may be performed with respect to each of the channels or may be performed with respect to each of the channels obtained by separating or combining the reception coils. The timing of the separating/combining process is not limited to the example described above. For example, the MR signal or the MR data may be separated or combined in units of the channels any time before the reconstructing process (explained later) performed by the processing circuitry 15.

The imaging controlling circuitry 121 is configured to perform an imaging process on the patient P, by controlling the gradient power source 105, the transmission circuitry 113, the reception circuitry 119, and the like according to an imaging protocol output from the processing circuitry 15. The imaging protocol includes a pulse sequence corresponding to the type of the medical examination. The imaging protocol defines: the magnitude of the electric current to be supplied to the gradient coil 103 by the gradient power source 105; the timing with which the electric current is to be supplied to the gradient coil 103 by the gradient power source 105; the magnitude and the time width of the radio frequency pulse to be supplied to the transmission coil 115 by the transmission circuitry 113; the timing with which the radio frequency pulse is to be supplied to the transmission coil 115 by the transmission circuitry 113; the timing with which the MR signal is to be received by the reception coil array 117; and the like. When having received the MR data from the reception circuitry 119 as a result of imaging the patient P by driving the gradient power source 105, the transmission circuitry 113, the reception circuitry 119, and the like, the imaging controlling circuitry 121 stores the received MR data into the memory 11.

The imaging controlling circuitry 121 is configured to acquire MR data (hereinafter, "sensitivity data") related to generating a sensitivity map, by using an arbitrary imaging method. The sensitivity map is a map indicating a distribution of sensitivity levels of the reception coils. A plurality of sensitivity maps respectively correspond to the plurality of reception coils included in the reception coil array 117 related to the acquisition of the MR data. For example, the sensitivity data is acquired by the imaging controlling circuitry 121 during a pre-scan including a locator scan, a map scan, and/or the like, prior to a main scan, which is the imaging that involves a parallel imaging process. The imaging controlling circuitry 121 may be realized by using a processor, for example.

The parallel imaging process is an imaging process obtained by combining, for the purpose of shortening the acquisition period of the MR signal, a simultaneous acquisition technique using a plurality of reception coils, with a reconstruction technique using MR data generated by a plurality of reception coils. Known examples of the parallel imaging process include Simultaneous Acquisition of Spatial Harmonics (SMASH), Sensitivity Encoding (SENSE), and Generalized Autocalibrating Partially Parallel Acquisitions (GRAPPA).

In the following sections, to explain specific examples, the main scan performed on the patient P is assumed to be a parallel imaging process (hereinafter, "first parallel imaging process") having an imaging protocol to acquire an MR signal related to a trajectory corresponding to an auto-calibration signal (hereinafter, "ACS") in a k-space. In other words, the first parallel imaging process related to the main scan has the imaging protocol similar to that of GRAPPA. The trajectory corresponding to the ACS used in the first parallel imaging process does not necessarily have to be in the vicinity of the center of the k-space unlike GRAPPA and may arbitrarily be set.

The MR data (hereinafter, "first MR data") acquired by each of the plurality of reception coils in the first parallel imaging process includes: data acquired while thinning out certain phase encoding steps in the k-space according to a thin-out ratio called a reduction factor "R" (which may also be called an acceleration factor) set in advance on the basis of a user instruction or the like; and the ACS. The ACS includes: target data at target points relevant to the positions of the thinning-out of the data; and source data at source points near the target points.

Further, the sensitivity data (second MR data) acquired in the pre-scan performed on the patient P is related to a SENSE-based parallel imaging process (hereinafter, "second parallel imaging process") by which an aliasing signal is separated in an image space. The sensitivity data is obtained through a volume scan performed on the patient P while using the WB coil and the plurality of reception coils. The second parallel imaging process has an imaging protocol to acquire a magnetic resonance signal in which aliasing in an image in the image space is unfolded by using a plurality of sensitivity maps corresponding to the plurality of reception coils. The second MR data is, for example, obtained through a pre-scan related to the second parallel imaging process (hereinafter, simply "pre-scan"). In other words, the second MR data corresponding to each of the plurality of reception coils includes data used for generating the corresponding one of the plurality of sensitivity maps.

The term "processor" denotes, for example, a Central Processing Unit (CPU), a Graphics Processing Unit (GPU), or circuitry such as an Application Specific Integrated Circuit (ASIC) or a programmable logic device (e.g., a Simple Programmable Logic Device [SPLD], a Complex Programmable Logic Device [CPLD], or a Field Programmable Gate Array [FPGA]).

As a hardware resource, the system controlling circuitry 123 includes a processor, memory elements such as a Read-Only Memory (ROM), a Random Access Memory (RAM), and/or the like (not illustrated). The system controlling circuitry 123 includes a system controlling function 23 and a g map generating function 25. The system controlling circuitry 123 configured to realize the system controlling function 23 and the g map generating function 25 corresponds to a system controlling unit and a g map generating unit. Functions such as the system controlling function 23 and the g map generating function 25 are stored in a memory installed in the system controlling circuitry 123 in the form of computer-executable programs. For example, the system controlling circuitry 123 is configured to realize the functions corresponding to the programs by reading and executing the programs from the memory. In other words, the system controlling circuitry 123 that has read the programs has the functions such as the system controlling function 23 and the g map generating function 25.

By employing the system controlling function 23, the system controlling circuitry 123 is configured to control the MRI apparatus 100. More specifically, the system controlling circuitry 123 is configured to read a system controlling program stored in the memory 11, to load the read program into a memory, and to control pieces of circuitry in the MRI apparatus 100 according to the loaded system controlling program. For example, on the basis of an image taking condition input by the operator via the input interface 125, the system controlling circuitry 123 is configured to read an imaging protocol from the memory 11. The system controlling circuitry 123 is configured to transmit the imaging protocol to the imaging controlling circuitry 121 so as to control the imaging process performed on the patient P.

By employing the g map generating function 25, the system controlling circuitry 123 is configured to generate a first g map corresponding to each of the plurality of reception coils, on the basis of the first MR data including the ACS corresponding to each of the plurality of reception coils and resulting from the first parallel imaging process. The first g map is a map indicating a spatial distribution of first g factors and is generated with respect to each of the reception coils. For example, the first g factors are each an index value indicating a degree of noise increase/reduction in an image (corresponding to each of the reception coils, for example) generated through the first parallel imaging process, as compared to noise in an image obtained through full sampling. The first g factors are dependent, for example, on geometric arrangement such as a relative positional relationship among the plurality of reception coils.

More specifically, the g map generating function 25 generates a g map of each of the plurality of reception coils, by calculating, with respect to each of the plurality of reception coils, the square root of a sum of squares of absolute values in a plurality of weight maps. The weight maps each correspond to a map indicating a distribution of weights used for unfolding aliasing in an MR image (hereinafter, "aliasing image") having aliasing and being generated by performing a Fourier transform on the first MR data corresponding to each of the plurality of reception coils. In other words, as a result of multiplying the aliasing image by a weight map corresponding to the aliasing image, the aliasing in the aliasing image is unfolded.

On the basis of the first MR data, the g map generating function 25 is configured to generate a plurality of weight maps for each of the reception coils. In this situation, in the weight map generating process performed by the g map generating function 25, it is assumed that noise correlations among the plurality of reception coils are resolved. Because the first MR data is complex data, the weight maps are represented by data expressed with a complex number having a real part and an imaginary part. Further, the aliasing image is a complex image. The multiplication of the aliasing image by a weight map is realized by calculating the product of complex numbers. For this reason, the absolute values in each of the weight maps correspond to the square root of the product of the real part and the imaginary part of the weight map (i.e., the product of the weight map and the Hermitian conjugate of the weight map). In the following paragraphs, the process of generating the weight maps will be explained.

On the basis of the ACSs in the first MR data corresponding to the plurality reception coils, the g map generating function 25 is configured to generate, with respect to each of the reception coils, a coil coefficient related to generating data (hereinafter, "thinned-out data") arranged in the k-space in the lines corresponding to the phase encoding steps that are thinned out. The coil coefficients correspond to the weights used for generating, in the k-space, the thinned-out data through a weighted addition on the first MR data corresponding to the plurality of reception coils. By arranging the generated coil coefficients in accordance with the thin-out ratio called the reduction factor, the g map generating function 25 generates, with respect to each of the reception coils, a convolution kernel that can be used for convolution on the first MR data performed to generate the thinned-out data.

The g map generating function 25 is configured to generate a coil coefficient map by filling a perimeter region of the convolution kernel with zeros (hereinafter, "zero-padding"), in accordance with the size of the aliasing image.

By performing an image transforming process such as a Fourier transform on the coil coefficient map, the g map generating function 25 is configured to generate the weight map in the image space. In the following paragraphs, the process of generating the coil coefficients will be explained.

Expression (1) presented below is a calibration matrix equation used for generating a j-th coil coefficient.

$$A_j x_j = b_j \tag{1}$$

The subscript "j" is an arbitrary natural number ranging from 1 to Nc which denotes the total quantity of the plurality of reception coils (hereinafter, "total coil quantity"). The matrix A on the left-hand side of Expression (1) is related to the coil coefficient related to generating the thinned-out data with respect to the first MR data obtained by the j-th reception coil and may be referred to as a calibration matrix. The calibration matrix $A_j$ is structured with source data related to all the target points related to the j-th reception coil, with regard to the ACSs corresponding to all the reception coils. For example, the calibration matrix $A_j$ is expressed as a matrix of m lines and n columns, where m denotes the quantity of the target points (i.e., the quantity of the positions of a plurality of calibrations), whereas n denotes the product of the total quantity of the coil coefficients and the total coil quantity Nc in one convolution kernel.

On the right-hand side of Expression (1), $$b_j$$

is related to a coil coefficient related to generating the thinned-out data with respect to the first MR data obtained by the j-th reception coil and is represented by a vector which has m lines and 1 column and of which the elements are target data of the first MR data acquired by the j-th reception coil.

On the right-hand side of Expression (1), $$x_j$$

is represented by a vector which has n lines and 1 column and of which the elements are the coil coefficients in the convolution kernel corresponding to each of the plurality of reception coils.

Expression (1) is an ill-conditioned linear equation. Accordingly, in order to calculate $x_j$ satisfying Expression (1), the g map generating function 25 implements Tikhonov regularization by using a regularization parameter $\lambda_j$ that varies in correspondence with each of the reception coils. The regularization parameter $\lambda_j$ may be referred to as a hyper parameter or a Tikhonov parameter. The standard form $$F_{\lambda j}(x_j)$$

according to the Tikhonov regularization with respect to the j-th reception coil may be expressed as presented in Expression (2) below:

$$F_{\lambda j}(x_j) = \|A_j x_j - b_j\|_2^2 + \lambda_j^2 \|x_j\|_2^2 \tag{2}$$

More specifically, the g map generating function 25 applies a singular value decomposition (hereinafter, "SVD") to the calibration matrix $A_j$. In this situation, it is possible to express the calibration matrix $A_j$ as indicated in Expression (3) presented below, where $U_j$ denotes a unitary matrix of m lines and m columns related to the j-th reception coil; $V_j^T$ denotes the transpose of a unitary matrix $V_j$ of n lines and n columns related to the j-th reception coil; and $\Sigma_j$ denotes a standard form of the SVD having m lines and n columns and being related to the j-th reception coil.

$$A_j = U_j \Sigma_j V_j^T \tag{3}$$

Each of the columns in the unitary matrix $U_j$ having the m lines and m columns corresponds to a left singular vector of the calibration matrix $A_j$. In the following sections, the unitary matrix $U_j$ having the m lines and m columns will be referred to as a left singular vector matrix. Further, each of the columns in the unitary matrix $V_j$ having the n lines and n columns corresponds to a right singular vector of the calibration matrix $A_j$. In the following sections, the unitary matrix $V_j$ having the n lines and n columns will be referred to as a right singular vector matrix. Further, it is possible to express the standard form $\Sigma_j$ of the SVD as presented below, by using a plurality of singular values ($\sigma_1, \ldots, \sigma_k$):

$$\Sigma_j = diag(\sigma_1, \cdots, \sigma_k, 0)$$
$$= \begin{bmatrix} diag(\sigma_1, \cdots, \sigma_k) & 0 \\ 0 & 0 \end{bmatrix}$$

In the above expression, the subscript k denotes a numerical rank in the calibration matrix $A_j$.

In this situation, it is possible to express the solution
$\hat{x}_j$
of the Tikhonov regularization with respect to the j-th reception coil, i.e., the coil coefficient indicating the convolution kernel for each reception coil to be applied to the first MR data corresponding to each of the plurality of reception coils, with regard to generating the data in the thin-out positions with respect to the first MR data corresponding to the j-th reception coil, as indicated in Expression (4) presented below by using a matrix $D_j$ of n lines and m columns:

$$D_j = \begin{bmatrix} \frac{\sigma_1}{\sigma_1^2 + \lambda_j^2} & 0 & 0 & \cdots & 0 & 0 \\ 0 & \frac{\sigma_1}{\sigma_2^2 + \lambda_j^2} & 0 & \ddots & \vdots & 0 \\ 0 & 0 & \ddots & \ddots & 0 & 0 \\ 0 & 0 & 0 & \frac{\sigma_1}{\sigma_{k-1}^2 + \lambda_j^2} & 0 & 0 \\ \vdots & \vdots & \ddots & \ddots & \frac{\sigma_1}{\sigma_k^2 + \lambda_j^2} & 0 \\ 0 & 0 & 0 & \cdots & 0 & 0 \end{bmatrix} \quad (4)$$

$$\hat{x}_j = V_j D_j U_j^T b_j$$

As indicated in Expression (4), the set of pieces of target data
$b_j$
is actually-acquired data and therefore contains noise. Accordingly, the noise has an impact on the solution
$\hat{x}_j$
of the Tikhonov regularization with respect to the j-th reception coil.

In the matrix $D_j$ in Expression (4), when the regularization parameter $\lambda_j$ with respect to the j-th reception coil is too small, i.e., when the regularization is too weak, the contribution to Expression (2) made by the regularization term (which may be called "penalty term") on the right-hand side of Expression (2) is small. In that situation, the solution
$\hat{x}_j$
of the Tikhonov regularization with respect to the j-th reception coil is sensitive to the noise contained in
$b_j$
expressing the set of pieces of target data. Accordingly, an MR image generated by using the first MR data contains a large amount of noise.

On the contrary, in the matrix $D_j$ in Expression (4), when the regularization parameter $\lambda_j$ with respect to the j-th reception coil is too large, i.e., when the regularization is too strong, the contribution to Expression (2) made by the regularization term on the right-hand side of Expression (2) is large. In that situation, the solution
$\hat{x}_j$
of the Tikhonov regularization with respect to the j-th reception coil is quite different from the true solution. Accordingly, an MR image generated by using the first MR data exhibits many artifacts.

Figure 3:
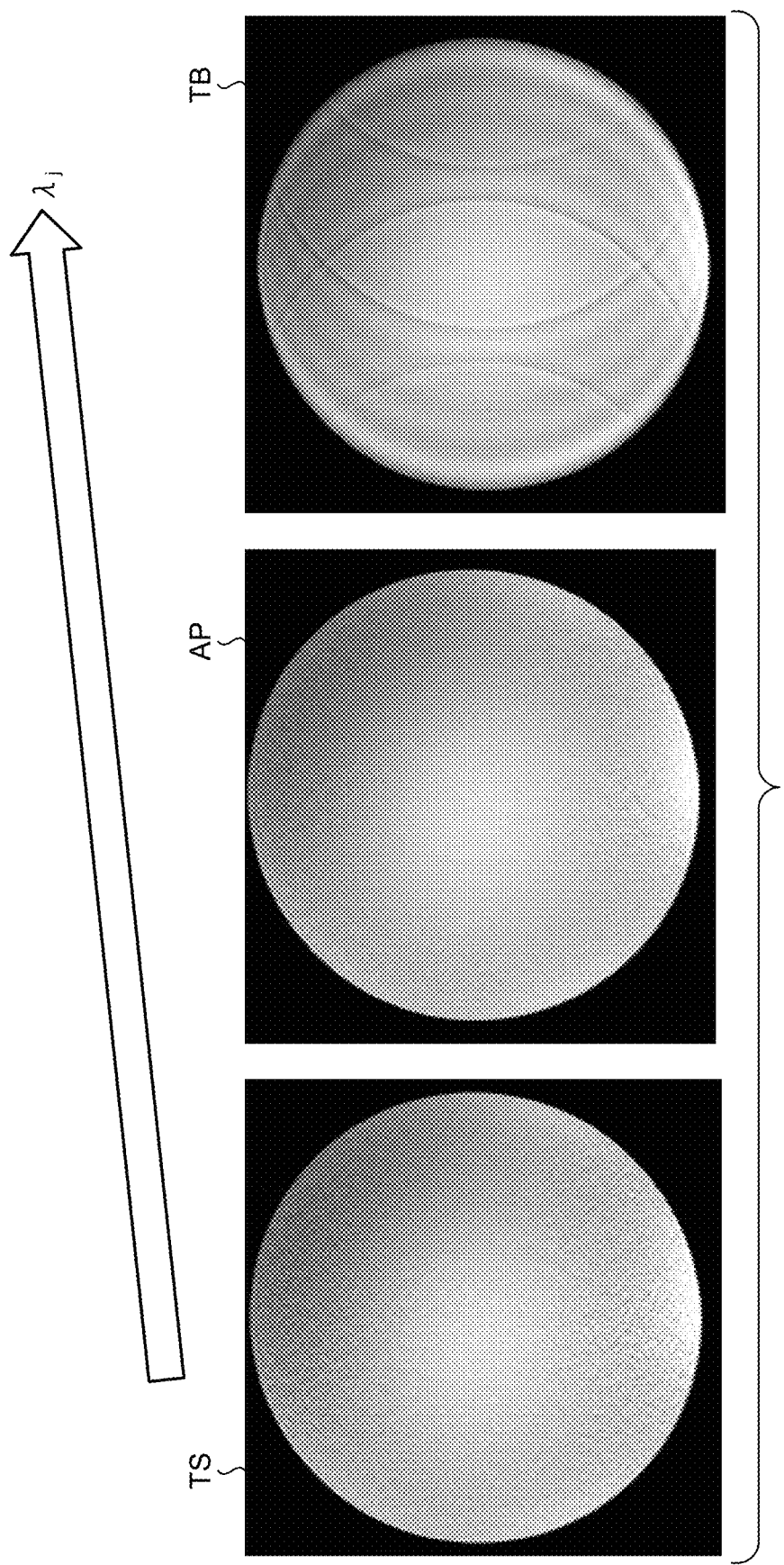
FIG. 3 is a drawing according to the embodiment illustrating examples of impacts on MR images depending on magnitudes of a regularization parameter.

FIG. 3 is a drawing illustrating examples of impacts on MR images depending on magnitudes of the regularization parameter $\lambda_j$. As observed in the image TS in FIG. 3, when the regularization parameter $\lambda_j$ is too small, the image TS has more noise than the image AP obtained by using the regularization parameter $\lambda_j$ having an appropriate value. On the contrary, as observed in the image TB in FIG. 3, when the regularization parameter $\lambda_j$ is too large, the image TB has more artifact noise than the image AP does. Accordingly, it is very important to set the regularization parameter $\lambda_j$ to have an optimal value.

In view of the circumstances described above, prior to the implementation of the Tikhonov regularization using the SVD, the g map generating function 25 is configured to determine, with respect to each of the reception coils, the regularization parameter $\lambda_j$, by using a Tikhonov parameter optimization method. Examples of the Tikhonov parameter optimization method include: a discrepancy principle, an L-curve method, and a Generalized Cross Validation (hereinafter, "GCV"). In the present embodiment, it is possible to use any of these methods for determining the regularization parameter $\lambda_j$.

For example, when the GCV is used for determining the regularization parameter $\lambda_j$, the g map generating function 25 is configured to determine an optimization criterion function with respect to the regularization parameter $\lambda_j$, on the basis of the first MR data corresponding to each of the plurality of reception coils, more specifically, by using the terms of Expression (1), the plurality of singular values generated through the SVD on the matrix the left singular vector matrix $U_j$, and the right singular vector matrix $V_1$. Subsequently, the g map generating function 25 determines a regularization parameter $\lambda_j$ corresponding to the time when the optimization criterion function exhibits a maximum value, as a hyper parameter sub-optimized to be used in the Tikhonov regularization. The regularization parameter $\lambda_j$ determined by using the Tikhonov parameter optimization method is stored in a storage device such as the memory 11 and is to be used in the Tikhonov regularization.

After having performed the various types of calculations and the processing steps described above, the g map generating function 25 generates the first g map indicating the distribution the first g factors related to each of the plurality of reception coils, on the basis of the first MR data corresponding to each of the plurality of reception coils. The plurality of pixels in the first g map have the first g factors generated by using the first MR data acquired through the first parallel imaging process performed while using the plurality of reception coils.

Figure 4:
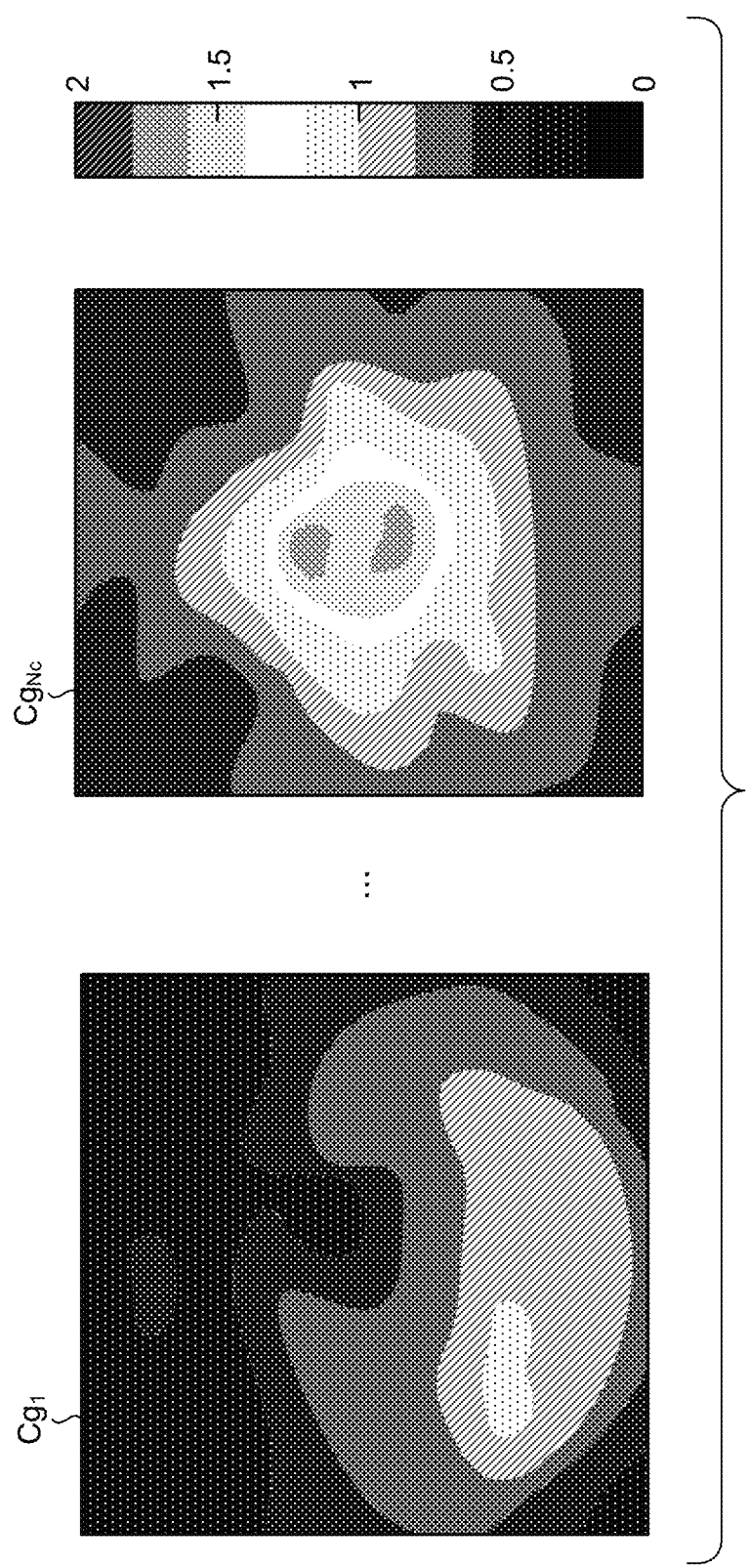
FIG. 4 is a drawing according to the embodiment illustrating an example of a plurality of first g maps corresponding to a plurality of reception coils.

FIG. 4 is a drawing illustrating an example of a plurality of first g maps corresponding to the plurality of reception coils. $Cg_1$ in FIG. 4 is a g map of the first reception coil. $Cg_{Nc}$ in FIG. 4 is a g map of the Nc-th reception coil. As illustrated in FIG. 4, the plurality of first g maps vary in correspondence with each of the reception coils.

The g map generating function 25 is configured to obtain, from the reception circuitry 119, the second MR data acquired through the pre-scan, to arrange the obtained second MR data in the k-space, and to generate (reconstruct) the sensitivity maps on the basis of the sensitivity data arranged in the k-space. In other words, on the basis of the second MR data related to the WB coil and the plurality of reception coils, the g map generating function 25 is configured to generate the plurality of sensitivity maps respectively corresponding to the plurality of reception coils, with respect to a desired cross-sectional plane based on a Field Of View (FOV) being set by using a locator image. The g map generating function 25 is configured to normalize the plurality of sensitivity maps by using a predetermined normalization method.

Alternatively, the process of generating and normalizing the plurality of sensitivity maps may be performed by a generating function 155. On the basis of the plurality of sensitivity maps, the g map generating function 25 is configured to generate a g map (hereinafter, "overall g map") related to the MR image generated through the second parallel imaging process. The g map generating function 25 is configured to generate second g maps respectively corresponding to the plurality of reception coils, by multiplying the overall g map by each of the plurality of normalized sensitivity maps. Because it is possible to adopt an existing method as the calculation method related to generating the second g maps, detailed explanations thereof will be omitted.

The second g map is a map indicating a spatial distribution of second g factors. The plurality of pixels in the second g map have the second g factors generated by using the second MR data related to the second parallel imaging process performed while using the plurality of reception coils. For example, the second g factors are each an index value indicating a degree of noise increase/reduction in an image generated through the second parallel imaging process, as compared to noise in an image obtained through full sampling. The second g factors are dependent, for example, on geometric arrangement such as a relative positional relationship among the plurality of reception coils.

The various types of processes performed by the g map generating function 25 described above may be realized by the generating function 155 included in the processing circuitry 15, for example. In that situation, the g map generating function 25 is installed in the processing circuitry 15.

Alternatively, the system controlling circuitry 123 may be incorporated in the processing circuitry 15. In that situation, the system controlling function 23 and the g map generating function 25 are executed by the processing circuitry 15, so that the processing circuitry 15 functions as a substitute for the system controlling circuitry 123. Because a processor that realizes the system controlling circuitry 123 is configured in the same manner as described above, the explanations thereof will be omitted.

The memory 11 is configured to store therein various types of programs related to the system controlling function 23 executed by the system controlling circuitry 123, various types of imaging protocols, image taking conditions including a plurality of imaging parameters that define the imaging protocols, and the like. Further, the memory 11 is configured to store therein an obtaining function 151, an adjusting function 153, and the generating function 155 realized by the processing circuitry 15 in the form of computer-executable programs.

Further, the memory 11 is configured to store therein MR images generated by the generating function 155 and the pre-scan image generated by performing the pre-scan such as the locator scan. The pre-scan image may be, for example, a position determining image (which may be called a "locator image") used for setting an imaging field of view (hereinafter, "Field Of View [FOV]") used in the main scan and the sensitivity maps used for generating (reconstructing) an MR image in the main scan.

For example, the memory 11 is configured to store therein the plurality of sensitivity maps respectively corresponding to the plurality of reception coils included in the reception coil array 117. Further, the memory 11 is configured to store therein the FOV set in the locator image according to a user instruction received via the input interface 125. The memory 11 is configured to store therein the MR data related to the main scan and an algorithm used for reconstructing the MR image on the basis of the MR data.

Further, the memory 11 may be configured to further store therein various types of data received via the communication interface 13. For example, the memory 11 may be configured store therein information (the site to be imaged, the purpose of the medical examination, etc.) which is related to a medical examination order for the patient P and is received from an information processing system within the medical institution such as a Radiology Information System (RIS). Further, the memory 11 is configured to store therein the plurality of first g maps and the plurality of second g maps corresponding to the plurality of reception coils, the plurality of singular values corresponding to each of the reception coils and being generated by the SVD, the left singular vector matrix U and the right singular vector matrix V of each of the reception coils, the plurality of weight maps corresponding to the plurality of reception coils, and the like.

For example, the memory 11 is realized by using a semiconductor memory element such as a ROM, a RAM, or a flash memory, or a Hard Disk Drive (HDD), a Solid State Drive (SSD), an optical disk, or the like. In other examples, the memory 11 may be realized by using a Compact Disc (CD)-ROM drive, a Digital Versatile Disc (DVD) drive, or a drive device that reads and writes various types of information from and to a portable storage medium such as a flash memory.

The input interface 125 is configured to receive various types of instructions and inputs of information from the operator. For example, the input interface 125 is realized by using a trackball, a switch button, a mouse, a keyboard, a touchpad on which input operations can be performed by touching an operation surface thereof, a touch screen in which a display screen and a touchpad are integrally formed, contactless input circuitry using an optical sensor, audio input circuitry, and/or the like. The input interface 125 is connected to the processing circuitry 15 and is configured to convert input operations received from the operator into electrical signals and to output the electrical signals to the processing circuitry 15.

In the present disclosure, the input interface 125 does not necessarily have to include physical operation component parts such as the mouse, the keyboard, and/or the like. Possible examples of the input interface 125 include electrical signal processing circuitry configured to receive an electrical signal corresponding to an input operation from an external input device provided separately from the MRI apparatus 100 and to output the received electrical signal to control circuitry.

According to an instruction from the user, the input interface 125 is configured to input the FOV to the locator image displayed on the display device 127. More specifically, to the locator image displayed on the display device 127, the input interface 125 inputs the FOV according to a range setting instruction given by the user. Further, the input interface 125 is configured to receive inputs of various types of imaging parameters related to the main scan, according to a user instruction based on a medical examination order.

Under control of either the processing circuitry 15 or the system controlling circuitry 123, the display device 127 is configured to display various types of Graphical User Interfaces (GUIs), the MR images generated by the processing circuitry 15, the pre-scan image such as the locator image, and the like. Further, the display device 127 is configured to display the imaging parameters related to the main scan and the pre-scan, as well as various types of information related to image processing processes, and the like. For example, the display device 127 is realized by using a display device such as a Cathode Ray Tube (CRT) display device, a liquid crystal display device, an organic Electroluminescence (EL) display device, a Light Emitting Diode (LED) display device, a plasma display device, or any of other arbitrary display devices and monitors that are known in the relevant technical field.

For example, the communication interface 13 is configured to perform data communication with the HIS, the PACS, and the like. The standard used for the communication between the communication interface 13 and the hospital information systems may be any standard. It is possible to use, for example, one or both of Health Level 7 (HL7) and Digital Imaging and Communications in Medicine (DICOM). The communication interface 13 is configured to receive the information (the site to be imaged, the purpose of the medical examination, etc.) which is related to the medical examination order for the patient P and is received from an information processing system within the medical institution such as the RIS.

Further, when the information processing apparatus 1 is not installed in the MRI apparatus 100, the communication interface 13 of the information processing apparatus 1 is configured to receive the plurality of first g maps, the plurality of second g maps, the plurality of singular values, and the plurality of weight maps from the medical image diagnosis apparatus related to MRI. In that situation, the plurality of first g maps, the plurality of second g maps, the plurality of singular values, the plurality of left singular vector matrices, the plurality of right singular vector matrices, and the plurality of weight maps having been received are stored into the memory 11.

For example, the processing circuitry 15 is realized by using the processor described above or the like. The processing circuitry 15 includes, among others, the obtaining function 151, the adjusting function 153, and the generating function 155. The processing circuitry 15 configured to realize the obtaining function 151, the adjusting function 153, and the generating function 155 corresponds to an obtaining unit, an adjusting unit, and a generating unit, respectively. The functions such as the obtaining function 151, the adjusting function 153, and the generating function 155 are stored in the memory 11 in the form of computer-executable programs. For example, the processing circuitry 15 is configured to realize the functions corresponding to the programs, by reading and executing the programs from the memory 11. In other words, the processing circuitry 15 that has read the programs have the functions such as the obtaining function 151, the adjusting function 153, and the generating function 155.

In the description above, the example was explained in which the "processor" is configured to read and execute the programs corresponding to the functions from the memory 11; however, possible embodiments are not limited to this example. When the processor is a CPU, for example, the processor realizes the functions by reading and executing the programs saved in the memory 11. In contrast, when the processor is an ASIC, the functions are directly incorporated in the circuitry of the processor as logic circuitry, instead of the programs being saved in the memory 11. Further, the processors according to the present embodiments do not each necessarily have to be structured as a single piece of circuitry. It is also acceptable to structure one processor by combining together a plurality of pieces of independent circuitry so as to realize the functions thereof. Further, although the example was explained in which the single piece of storage circuitry stores therein the programs corresponding to the processing functions, it is also acceptable to arrange a plurality of pieces of storage circuitry in a distributed manner, so that the processing circuitry 15 reads a corresponding program from each of the individual pieces of storage circuitry.

By employing the obtaining function 151, the processing circuitry 15 is configured to obtain: the first g factors generated by using the first MR data acquired through the first parallel imaging process performed by using the plurality of reception coils; and the second g factors generated by using the second MR data related to the second parallel imaging process performed by using the plurality of reception coils. More specifically, the obtaining function 151 is configured to obtain the plurality of first g maps, the plurality of second g maps, the plurality of singular values, and the plurality of weight maps corresponding to the plurality of reception coils, from either the system controlling circuitry 123 or the memory 11. When the information processing apparatus 1 is not installed in the MRI apparatus 100, the obtaining function 151 is configured to obtain the plurality of first g maps, the plurality of second g maps, the plurality of singular values corresponding to each of the plurality of reception coils, the plurality of left singular vector matrices, the plurality of right singular vector matrices, and the plurality of weight maps, from the medical image diagnosis apparatus related to MRI, via the communication interface 13.

By employing the adjusting function 153, the processing circuitry 15 is configured to adjust the first g factors so as to reduce the differences between the first g factor and the second g factor. More specifically, the adjusting function 153 is configured to adjust the first g factors, by changing the regularization parameter used in the process of generating the first g factors from the first MR data. Further, with respect to each of the plurality of reception coils, the adjusting function 153 is configured to adjust the first g factors. For example, the adjusting function 153 adjusts the first g factors by increasing the regularization parameter until an upper limit value is reached, the regularization parameter being used in the process of generating the first g factors from the first MR data.

More specifically, the adjusting function 153 is configured to adjust the first g factors so as to reduce the differences between (i) a plurality of first g factors included in a first region having g factor values equal to or larger than a threshold value within the first g map indicating the distribution of values of the first g factors and (ii) a plurality of second g factors included in a second region corresponding to the first region within the second g map indicating the distribution of values of the second g factors. For example, the adjusting function 153 adjusts the first g factors so as to reduce the difference between an average value of the plurality of first g factors included in the first region and an average value of the plurality of second g factors included in the second region. The process related to adjusting the first g factors performed by the adjusting function 153 will be explained in detail in the description of an image generating process in which an MR image related to the first parallel imaging process is generated by adjusting the g factors.

By employing the generating function 155, the processing circuitry 15 is configured to obtain, from the reception circuitry 119, the MR data (hereinafter, "pre-scan data") generated by performing the pre-scan on the patient P and to arrange the obtained pre-scan data in the k-space, so as to generate the pre-scan image such as the locator image or the sensitivity map on the basis of the pre-scan data arranged in the k-space. The generating function 155 is configured to store the generated pre-scan image into the memory 11. Because it is possible to adopt an existing reconstruction method for the process of generating the pre-scan image, the explanations thereof will be omitted.

By using the first MR data and weights related to the adjusted first g factors, the generating function 155 is configured to generate an MR image (hereinafter, "main scan image") related to the first parallel imaging process. More specifically, the generating function 155 is configured to generate an aliasing image corresponding to each of the plurality of reception coils, by performing a Fourier transform on the first MR data corresponding to each of the plurality of reception coils. The generating function 155 is configured to generate the main scan image by using the plurality of aliasing images respectively corresponding to the plurality of reception coils, the plurality of weight maps that are related to the adjusted first g factors and that respectively correspond to the plurality of reception coils, and the sensitivity maps respectively corresponding to the plurality of reception coils. The process of generating the main scan image performed by the generating function 155 will be explained in detail in the description of the image generating process.

Figure 5:
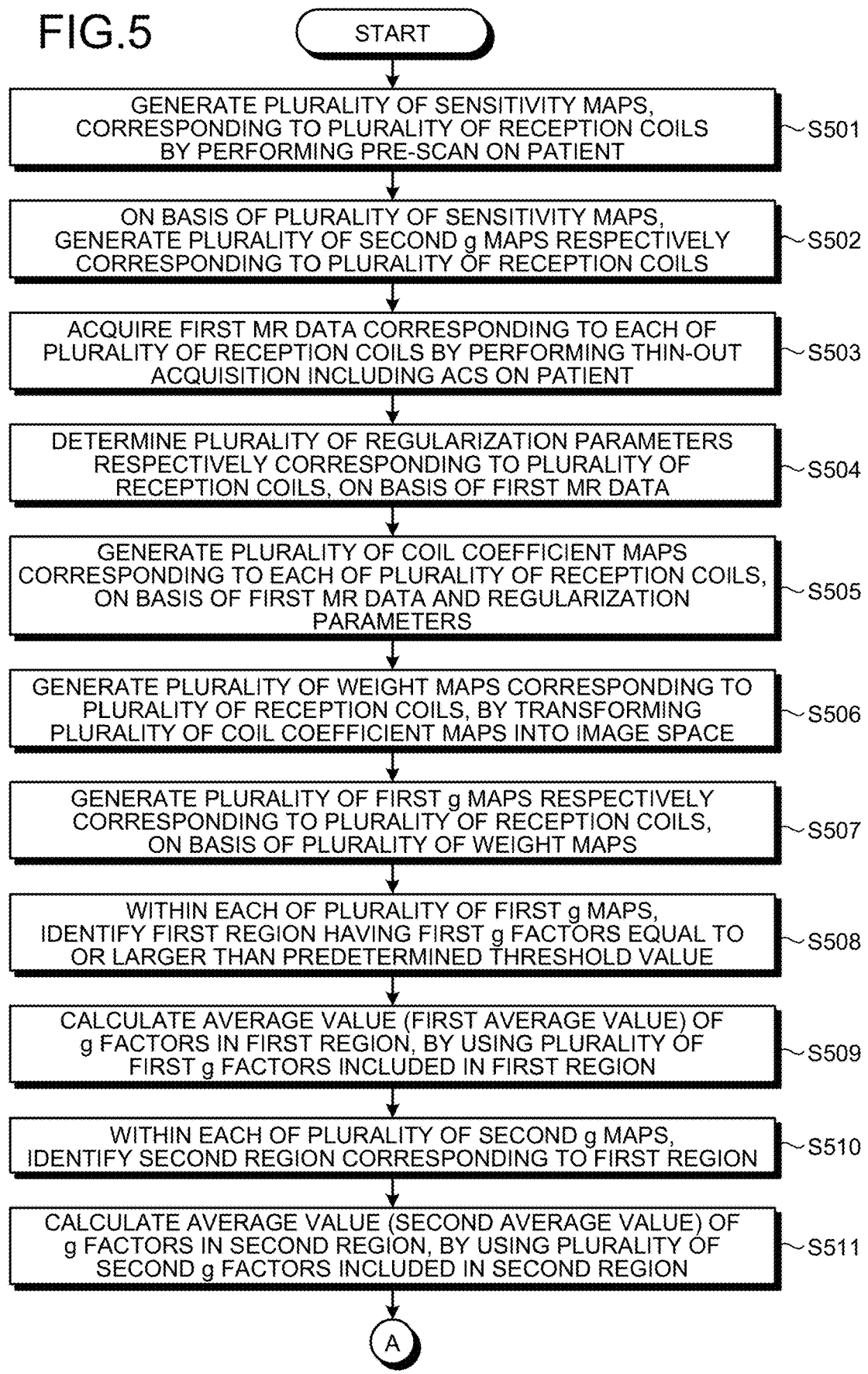
FIG. 5 is a flowchart according to the embodiment illustrating an example of a procedure in an image generating process.
Figure 6:
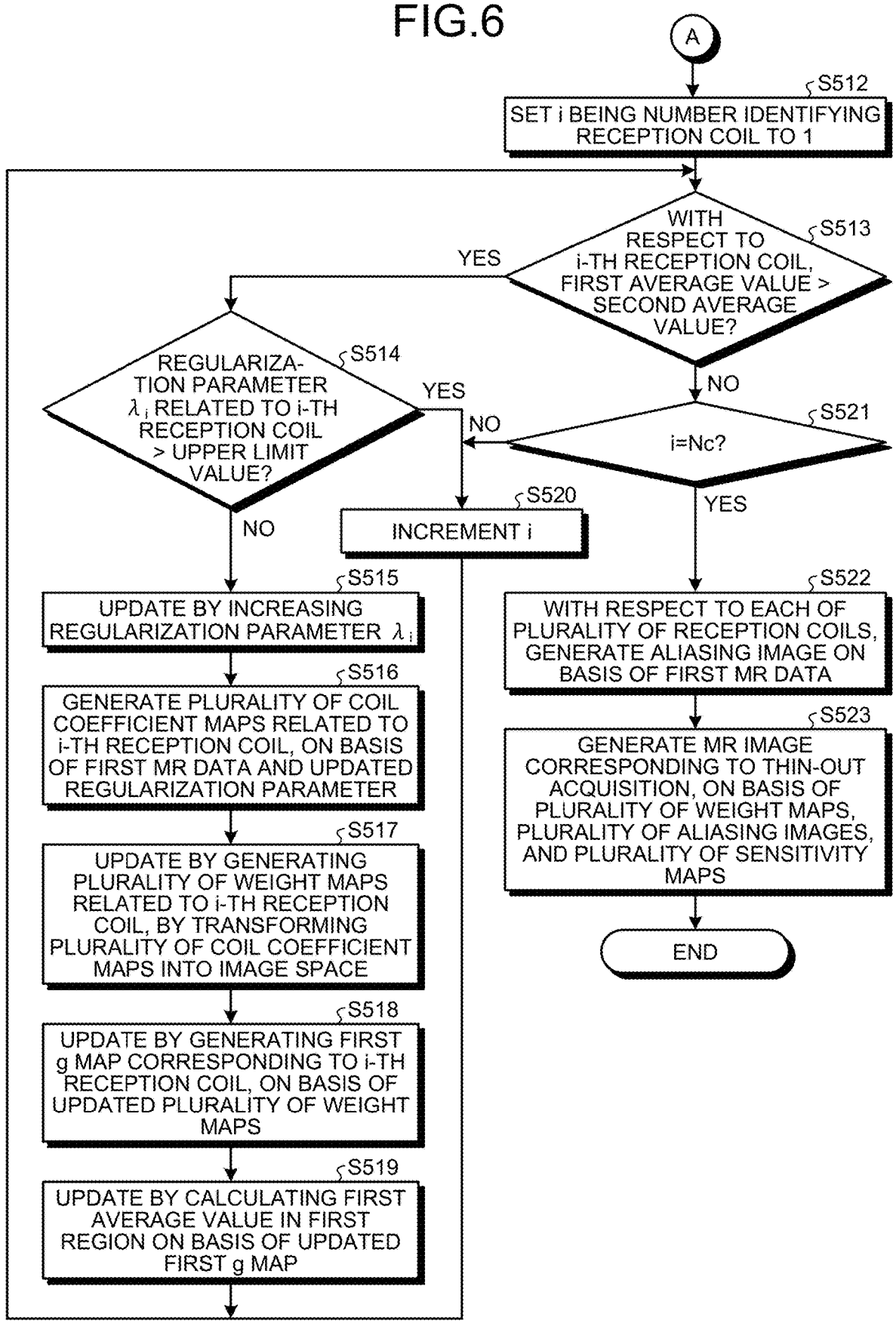
FIG. 6 is another flowchart according to the embodiment illustrating the example of the procedure in the image generating process.

The image generating process performed by the MRI apparatus 100 and the information processing apparatus 1 according to the present embodiment configured as described above will be explained with reference to FIGS. 5 to 12 and so on. FIGS. 5 and 6 are flowcharts illustrating an example of a procedure in the image generating process.

The Image Generating Process:

Step S501:

The imaging controlling circuitry 121 implements a pre-scan (an imaging protocol to acquire sensitivity data, among the imaging protocols related to the second parallel imaging process) on the patient P. As a result, the imaging controlling circuitry 121 has acquired the second MR data corresponding to each of the plurality of reception coils. The g map generating function 25 generates sensitivity maps on the basis of the second MR data. The memory 11 stores therein the plurality of sensitivity maps respectively corresponding to the plurality of reception coils.

Step S502:

The g map generating function 25 generates an overall g map on the basis of the plurality of sensitivity maps. Subsequently, the g map generating function 25 multiplies the overall g map by each of the plurality of normalized sensitivity maps. As a result, the g map generating function 25 has generated a plurality of second g maps respectively corresponding to the plurality of reception coils. Because the second g maps serve as a reference in the comparison with the first g maps, the second g maps may be referred to as reference maps.

Figure 7:
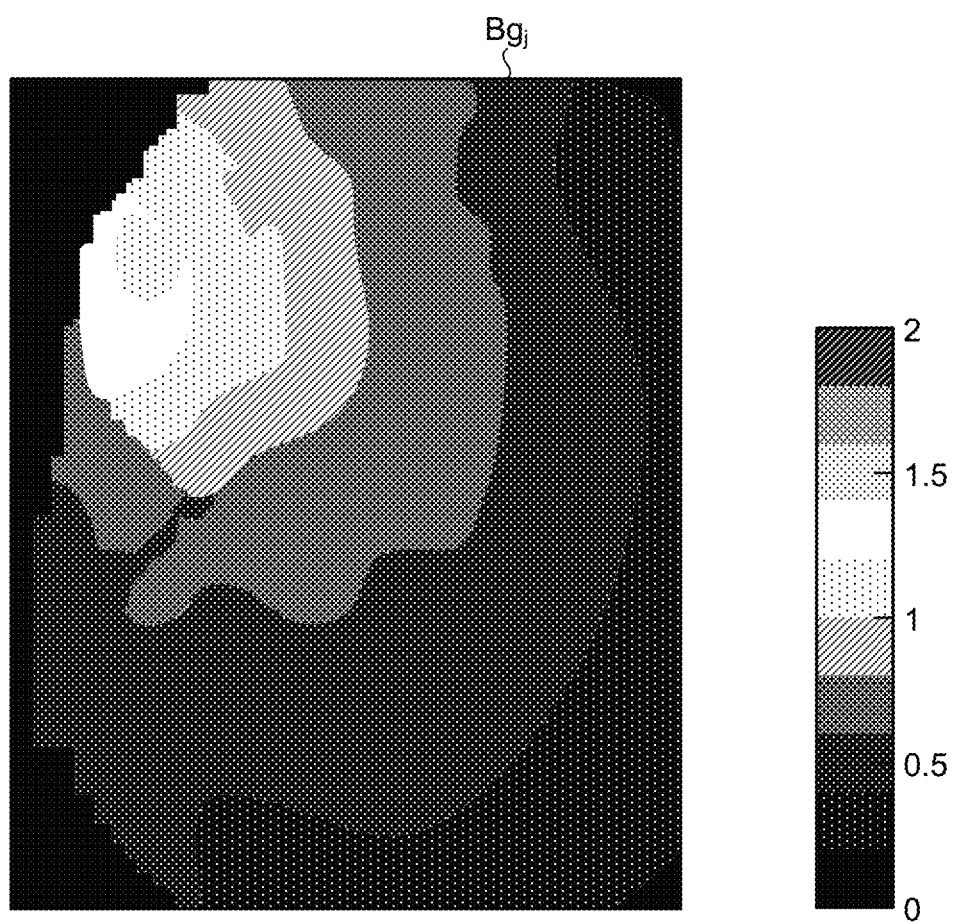
FIG. 7 is a drawing according to the embodiment illustrating an example of a second g map corresponding to a j-th reception coil.

FIG. 7 is a drawing illustrating an example of a second g map $Bg_j$ corresponding to the j-th reception coil. As illustrated in FIG. 7, the g map generating function 25 generates the j-th second g map $Bg_j$ in an image space corresponding to the aliasing image corresponding to the j-th reception coil. The legend on the right side of FIG. 7 expresses values of the second g factors.

Step S503:

The imaging controlling circuitry 121 performs a main scan on the patient P. The main scan is related to the first parallel imaging process and has an imaging protocol to perform the thin-out acquisition including the ACS on the patient P. As a result, the imaging controlling circuitry 121 has acquired the first MR data corresponding to each of the plurality of reception coils. The imaging controlling circuitry 121 stores the acquired first MR data into the memory 11 so as to be kept in association with numbers identifying the reception coils.

Step S504:

On the basis of the first MR data, the g map generating function 25 determines a plurality of regularization parameters λ respectively corresponding to the plurality of reception coils, by implementing the GCV, for example. In the following sections, an example will be explained in which a regularization parameter $\lambda_j$ (where j is a natural number satisfying 1≤j≤Nc [the total coil quantity]) related to the j-th reception coil is determined by implementing the GCV. At first, the g map generating function 25 calculates the plurality of singular values ($\sigma_1, \ldots, \sigma_k$), the left singular vector matrix $U_j$, and the right singular vector matrix $V_j$, by performing the SVD on the calibration matrix $A_j$.

Subsequently, on the basis of the plurality of singular values ($\sigma_1, \ldots, \sigma_k$), the left singular vector matrix $U_j$, and the right singular vector matrix $V_j$, the g map generating function 25 determines an optimization criterion function that uses the regularization parameter as a variable thereof. After that, the g map generating function 25 determines a regularization parameter maximized with the optimization criterion function as the regularization parameter $\lambda_j$ to be used in the Tikhonov regularization.

The process at the present step is repeatedly performed until a plurality of regularization parameters ($\lambda_1, \ldots \lambda_1, \ldots, \lambda_{Nc}$) respectively corresponding to the plurality of reception coils are determined. The g map generating function 25 stores the generated plurality of regularization parameters, the plurality of left singular vector matrices $U_j$, and the plurality of right singular vector matrices $V_j$ into the memory 11, so as to be kept in association with the numbers identifying the reception coils.

Step S505:

The g map generating function 25 generates a plurality of coil coefficient maps corresponding to each of the plurality of reception coils, on the basis of the first MR data and the regularization parameters. In the following sections, to explain a specific example, a process of generating coil coefficient maps with respect to the j-th reception coil will be explained. The g map generating function 25 generates the plurality of coil coefficients corresponding to each of the plurality of reception coils, by implementing the Tikhonov regularization that uses the regularization parameter $\lambda_j$, as well as the left singular vector matrix $U_j$ and the right singular vector matrix $V_j$ corresponding to the j-th reception coil.

With respect to each of the plurality of reception coils, the g map generating function 25 arranges the plurality of coil coefficients in accordance with the thin-out ratio called the reduction factor related to the first parallel imaging process. As a result, the g map generating function 25 has generated a plurality of convolution kernels respectively corresponding to the plurality of reception coils. Subsequently, with respect to each of the plurality of convolution kernels, the g map generating function 25 performs the zero-padding process regarding the perimeter region of the convolution kernel, so as to generate the plurality coil coefficient maps respectively corresponding to the plurality of reception coils. The process at the present step is repeatedly performed until a plurality of coil coefficient maps corresponding to each of the plurality of reception coils are generated.

Step S506:

The g map generating function 25 generates a plurality of weight maps in the image space corresponding to each of the plurality of reception coils, by performing a Fourier transform on each of the plurality of coil coefficient maps. The total quantity of the plurality of weight maps is equal to the square of Nc. The g map generating function 25 stores the plurality of weight maps into the memory 11 so as to be kept in association with the numbers identifying the reception coils.

Step S507:

The g map generating function 25 generates a plurality of first g maps respectively corresponding to the plurality of reception coils on the basis of the plurality of weight maps. In the following sections, to explain a specific example, the process of generating the first g map with respect to the j-th reception coil will be explained. With respect to each of the plurality of weight maps related to the j-th reception coil, the g map generating function 25 calculates the squares of the absolute values. The squares of the absolute values in a weight map correspond to the products of the real parts and the imaginary parts in the weight map. The g map generating function 25 accumulates the calculated squares of the absolute values with respect to the total quantity of the weight maps related to the j-th reception coil, i.e., the total coil quantity Nc. Subsequently, the g map generating function 25 generates the first g map related to the j-th reception coil by calculating the square root of the accumulated result.

Figure 8:
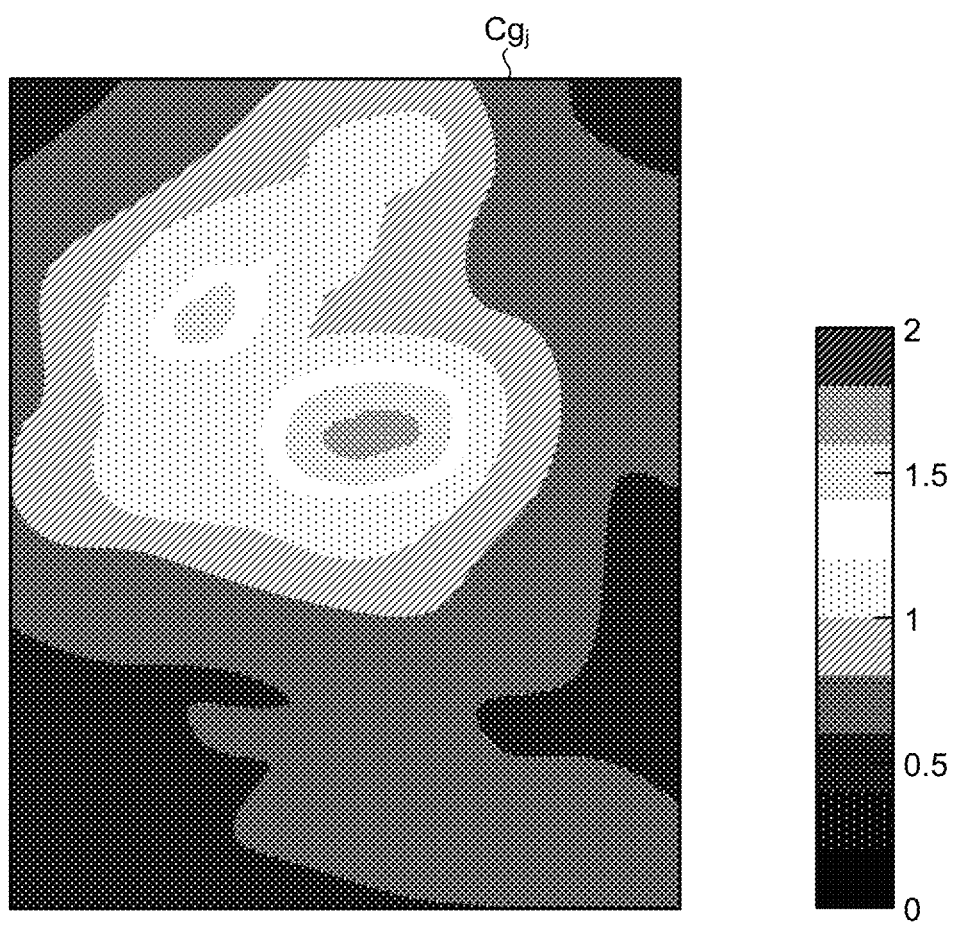
FIG. 8 is a drawing according to the embodiment illustrating an example of a first g map corresponding to the j-th reception coil.

FIG. 8 is a drawing illustrating an example of the first g map $Cg_j$ corresponding to the j-th reception coil. As illustrated in FIG. 8, the g map generating function 25 generates the j-th first g map $Cg_j$ in the image space corresponding to the aliasing image corresponding to the j-th reception coil. The legend on the right side of FIG. 8 expresses values of the first g factors.

The process at the present step is repeatedly performed until a plurality of first g maps respectively corresponding to the plurality of reception coils are generated. The g map generating function 25 stores the generated plurality of first g maps into the memory 11 so as to be kept in association with the numbers identifying the reception coils. Because the first g maps are compared while using the second g maps as a reference, the first g maps may be referred to as comparison maps.

When the information processing apparatus 1 is not installed in the MRI apparatus 100, the process at step S508 and thereafter are performed as an image generating process. In that situation, at a stage preceding the process at step S508, the processing circuitry 15 obtains, by employing the obtaining function 151, the plurality of first g maps, the plurality of second g maps, the plurality of singular values corresponding to each of the plurality of reception coils, the plurality of left singular vector matrices, the plurality of right singular vector matrices, and the plurality of weight maps, from the medical image diagnosis apparatus related to MRI, via the communication interface 13. In addition, the obtaining function 151 stores the plurality of first g maps, the plurality of second g maps, the plurality of singular values corresponding to each of the plurality of reception coils, the plurality of left singular vector matrices, the plurality of right singular vector matrices, and the plurality of weight maps, into the memory 11.

Step S508:

By employing the adjusting function 153, the processing circuitry 15 identifies the first region having first g factors equal to or larger than the predetermined threshold value, within each of the plurality of first g maps. The predetermined threshold value is set in advance and is stored in the memory 11. For example, the adjusting function 153 identifies the first region, by performing a segmentation process on the plurality of first g maps while using the predetermined threshold value. The adjusting function 153 stores, into the memory 11, the first region being the region that is masked within the plurality of first g maps respectively corresponding to the plurality of reception coils.

Figure 9:
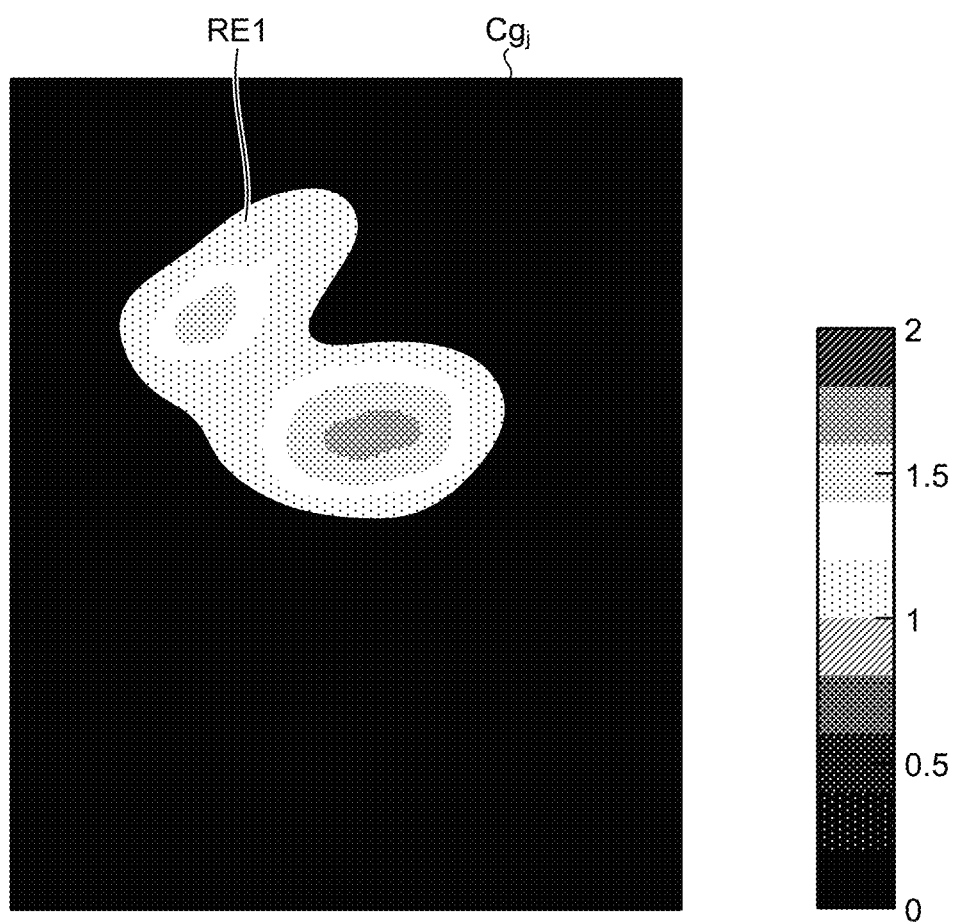
FIG. 9 is a drawing according to the embodiment illustrating an example of a result of a segmentation process using a predetermined threshold value and performed on the first g map corresponding to the j-th reception coil illustrated in FIG. 8.

FIG. 9 is a drawing illustrating an example of a result of the segmentation process using a predetermined threshold value and performed on the first g map $Cg_j$ corresponding to the j-th reception coil illustrated in FIG. 8. FIG. 9 indicates the result of the segmentation process using 1.25 as the predetermined threshold value. As illustrated in FIG. 9, the region excluding the region RE1 having values smaller than the predetermined threshold value corresponds to the masked region in the first g map $Cg_j$.

Step S509:

By employing the adjusting function 153, the processing circuitry 15 calculates, with respect to each of the identified plurality of first regions, an average value (hereinafter, "first average value") of the plurality of first g factors included in the first region. In other words, the adjusting function 153 calculates a plurality of first average values corresponding to the plurality of first regions. The adjusting function 153 stores the plurality of first average values into the memory 11, so as to be kept in correspondence with the plurality of first g maps.

Step S510:

By employing the adjusting function 153, the processing circuitry 15 identifies the second region corresponding to the first region, within each of the plurality of second g maps. In other words, within each of the plurality of second g maps, the adjusting function 153 identifies the same region as the first region in the first g map corresponding to the second g map, as the second region.

Figure 10:
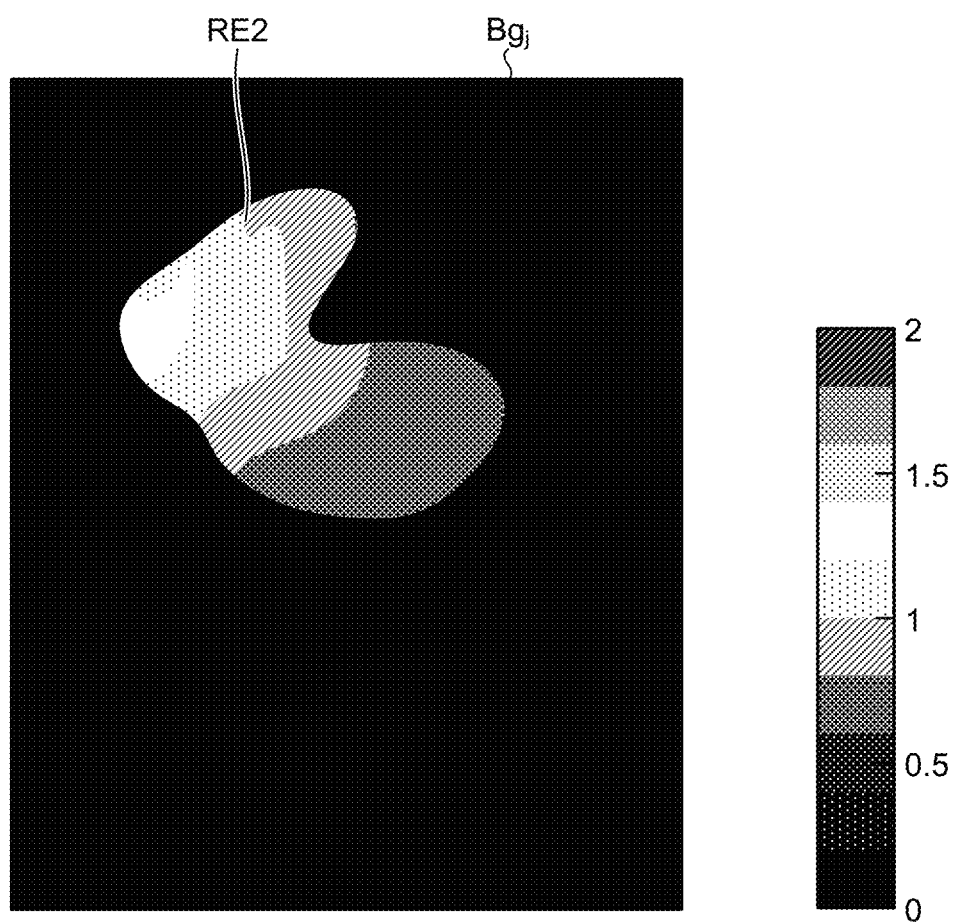
FIG. 10 is a drawing according to the embodiment illustrating an example of a second region being the same as the first region, with respect to the second g map corresponding to the j-th reception coil illustrated in FIG. 7.

FIG. 10 is a drawing illustrating an example of a second region RE2 being the same region as the first region RE1, with respect to the second g map $Bg_j$ corresponding to the j-th reception coil illustrated in FIG. 7. As illustrated in FIG. 10, the region excluding the second region RE2 corresponds to the masked region in the second g map $Bg_j$. The second region RE2 is the same region as the first region RE1 in the first g map $Cg_j$.

Step S511:

By employing the adjusting function 153, with respect to each of the identified plurality of second regions, the processing circuitry 15 calculates an average value (hereinafter, "second average value") of the plurality of second g factors included in the second region. In other words, the adjusting function 153 calculates a plurality of second average values corresponding to the plurality of second regions. The adjusting function 153 stores the plurality of second average values into the memory 11 so as to be kept in correspondence with the plurality of second g maps.

Step S512:

By employing the adjusting function 153, the processing circuitry 15 sets the i being a number identifying the reception coil to 1. Alternatively, it is possible to perform this step at any arbitrary stage before step S512.

Step S513:

By employing the adjusting function 153, the processing circuitry 15 judges, with respect to the i-th reception coil, whether or not the first average value exceeds the second average value. When the first average value exceeds the second average value (step S513: Yes), the process at step S514 will be performed. On the contrary, when the first average value does not exceed the second average value (step S513: No), the process at step S521 will be performed. Alternatively, as the judging process at the present step, the adjusting function 153 may judge whether or not the first average value exceeds a value around the second average value.

Step S514:

By employing the adjusting function 153, the processing circuitry 15 judges whether or not the regularization parameter $\lambda_i$ related to the i-th reception coil exceeds the upper limit value. When the regularization parameter $\lambda_i$ exceeds the upper limit value (step S514: Yes), the process at step S520 will be performed. On the contrary, when the regularization parameter $\lambda_i$ does not exceed the upper limit value (step S514: No), the process at step S515 will be performed.

The upper limit value for each of the reception coils used at the present step may be, for example, a natural number multiple (e.g., a ten-time multiple) of the regularization parameter determined for each reception coil through the GCV at step S504. In this situation, the adjusting function 153 calculates, prior to the process at step S514, the plurality of upper limit values corresponding to the plurality of reception coils, by multiplying each of the plurality of regularization parameters determined at the step S504 by the natural number. Subsequently, the adjusting function 153 stores the calculated plurality of upper limit values into the memory 11 together with the numbers identifying the reception coils.

Step S515:

By employing the adjusting function 153, the processing circuitry 15 increases the regularization parameter $\lambda_i$ related to the i-th reception coil. For example, the adjusting function 153 increases the regularization parameter $\lambda_i$ by multiplying the regularization parameter $\lambda_i$ by a predetermined ratio "Ra" being 1 or larger. The predetermined ratio may be, for example, a numerical value such as 1.41 ($2^{1/2}$) and is stored in the memory 11, in advance. The adjusting function 153 stores the value ($\lambda_i \times Ra$) obtained by multiplying the regularization parameter $\lambda_i$ by the predetermined ratio "Ra" into the memory 11 as a new regularization parameter $\lambda_i$ related to the i-th reception coil, so as to be kept in association with the number i identifying the reception coil. Thus, the regularization parameter $\lambda_i$ has been updated.

Step S516:

By employing the adjusting function 153, the processing circuitry 15 generates a plurality of coil coefficient maps related to the i-th reception coil, on the basis of the first MR data and the updated regularization parameter $\lambda_i$. More specifically, the adjusting function 153 implements the Tikhonov regularization by using the left singular vector matrix $U_i$ related to the i-th reception coil, the right singular vector matrix $V_i$ related to the i-th reception coil, the plurality of singular values, and the updated regularization parameter $\lambda_i$.

As a result, with respect to the i-th reception coil, the adjusting function 153 calculates a plurality of coil coefficients (the components of the vector presented below), $\hat{x}_i$ corresponding to each of the plurality of reception coils.

With respect to each of the plurality of reception coils, the adjusting function 153 classifies the components of the solution $\hat{x}_i$ to the Tikhonov regularization. Subsequently, with respect to each of the plurality of reception coils, the adjusting function 153 generates a convolution kernel by using the classified components in accordance with the thin-out ratio called the reduction factor related to the first parallel imaging process. The adjusting function 153 performs the zero-padding process on each of the plurality of convolution kernel respectively corresponding to the plurality of reception coils, so as to generate a plurality of coil coefficient maps related to the i-th reception coil. The adjusting function 153 stores the updated plurality of coil coefficient maps into the memory 11, so as to be kept in association with the number i identifying the reception coil.

Step S517:

By employing the adjusting function 153, the processing circuitry 15 updates by generating a plurality of weight maps related to the i-th reception coil, by transforming the plurality of coil coefficient maps into an image space. More specifically, with respect to the i-th reception coil, the adjusting function 153 generates the plurality of weight maps respectively corresponding to the plurality of reception coils, by performing an image transforming process on each of the plurality of coil coefficient maps. The adjusting function 153 stores the updated plurality of weight maps into the memory 11, so as to be kept in association with the number i identifying the reception coil.

Step S518:

By employing the adjusting function 153, the processing circuitry 15 updates by generating a first g map corresponding to the i-th reception coil on the basis of the updated plurality of weight maps. More specifically, the adjusting function 153 calculates the squares of the absolute values in each of the plurality of weight maps and further accumulates the calculated squares of the absolute values with respect to the total coil quantity Nc. Subsequently, the adjusting function 153 generates the first g map corresponding to the i-th reception coil, by calculating the square root of the accumulated result. The adjusting function 153 stores the updated first g map into the memory 11, so as to be kept in association with the number i identifying the reception coil.

Step S519:

By employing the adjusting function 153, the processing circuitry 15 updates by calculating the first average value in the first region, on the basis of the updated first g map. More specifically, within the updated first g map, the adjusting function 153 identifies the same region as the first region identified at step S508. Subsequently, by calculating an average value while using the plurality of first g factors included in the identified first region, the adjusting function 153 calculates the first average value. The adjusting function 153 stores the calculated first average value being updated into the memory 11, so as to be kept in association with the number i identifying the reception coil.

Step S520:

By employing the adjusting function 153, the processing circuitry 15 increments the i being the number identifying the reception coil.

Figure 11:
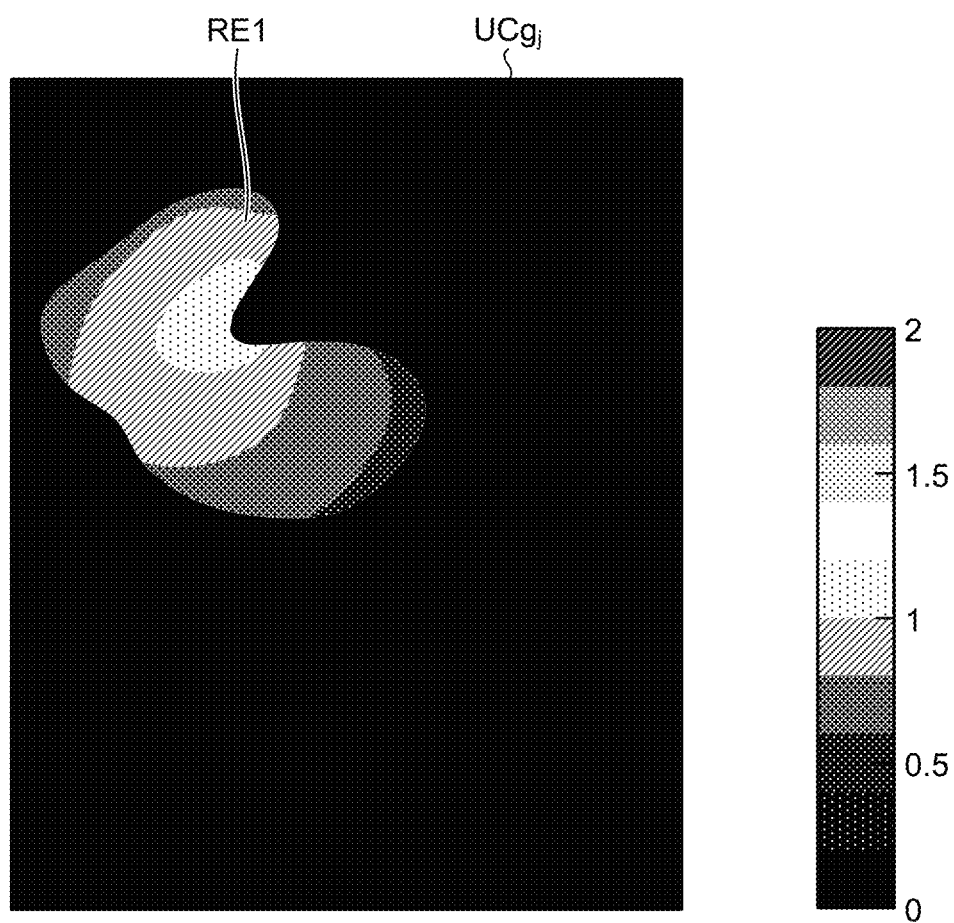
FIG. 11 is a drawing according to the embodiment illustrating an example of a distribution of first g factors in the first region, within the first g map updated by increasing a regularization parameter corresponding to the j-th reception coil.

FIG. 11 is a drawing illustrating an example of a distribution of the first g factors in the first region RE1, within the first g map UCg$_j$ updated by increasing the regularization parameter λ$_j$ corresponding to the j-th reception coil. As illustrated in FIG. 11, the first g factors in the first region RE1 have been reduced compared to those in FIG. 9.

Step S521:

By employing the adjusting function 153, when the i being the number identifying the reception coil is equal to the total coil quantity Nc (step S521: Yes), the processing circuitry 15 will perform the process at step S522. On the contrary, when the i being the number identifying the reception coil is not equal to the total coil quantity Nc (step S521: No), the process at step S520 will be performed. When the judgment result is "Yes" in the process at the present step, the process (hereinafter, "g factor adjusting process") of adjusting the first g factors with respect to the plurality of reception coils, so as to reduce the differences between the first g factors and the second g factors has been completed. For example, the g factor adjusting process corresponds to the processing procedure from steps S508 through S521. For example, the g factor adjusting process described above is performed for the real part and for the imaginary part.

In the g factor adjusting process, by changing the regularization parameter used in the process of generating the first g factors from the first MR data, the adjusting function 153 adjusts, with respect to each of the plurality of reception coils, the first g factors so as to reduce the differences between the first g factors and the second g factors. As described in step S514, the adjusting function 153 adjusts the first g factors by increasing the regularization parameter until the regularization parameter reaches an upper limit. To explain further in detail, the adjusting function 153 adjusts the first g factors so as to reduce the differences between the plurality of first g factors included in the first region and the plurality of second g factors included in the second region. More specifically, the adjusting function 153 adjusts the first g factors so as to reduce the difference between the first average value and the second average value.

Alternatively, one or more of the plurality of judging processes performed at steps S513, S514, and S521 may be performed by a judging function separately provided in the processing circuitry 15. Further, although FIG. 6 describes the plurality of processes at steps S513 through S519 as a procedure performed with respect to each of the reception coils, it is also acceptable to simultaneously perform the processes in parallel, with respect to two or more of the reception coils.

Step S522:

By employing the generating function 155, the processing circuitry 15 generates an aliasing image on the basis of the first MR data, with respect to each of the plurality of reception coils. More specifically, by performing a Fourier transform on the first MR data corresponding to each of the plurality of reception coils, the generating function 155 generates the aliasing image corresponding to each of the plurality of reception coils. In other words, the generating function 155 generates a plurality of aliasing images corresponding to the plurality of reception coils. The generating function 155 stores the generated plurality of aliasing images into the memory 11, so as to be kept in association with the numbers i identifying the reception coils.

Figure 12:
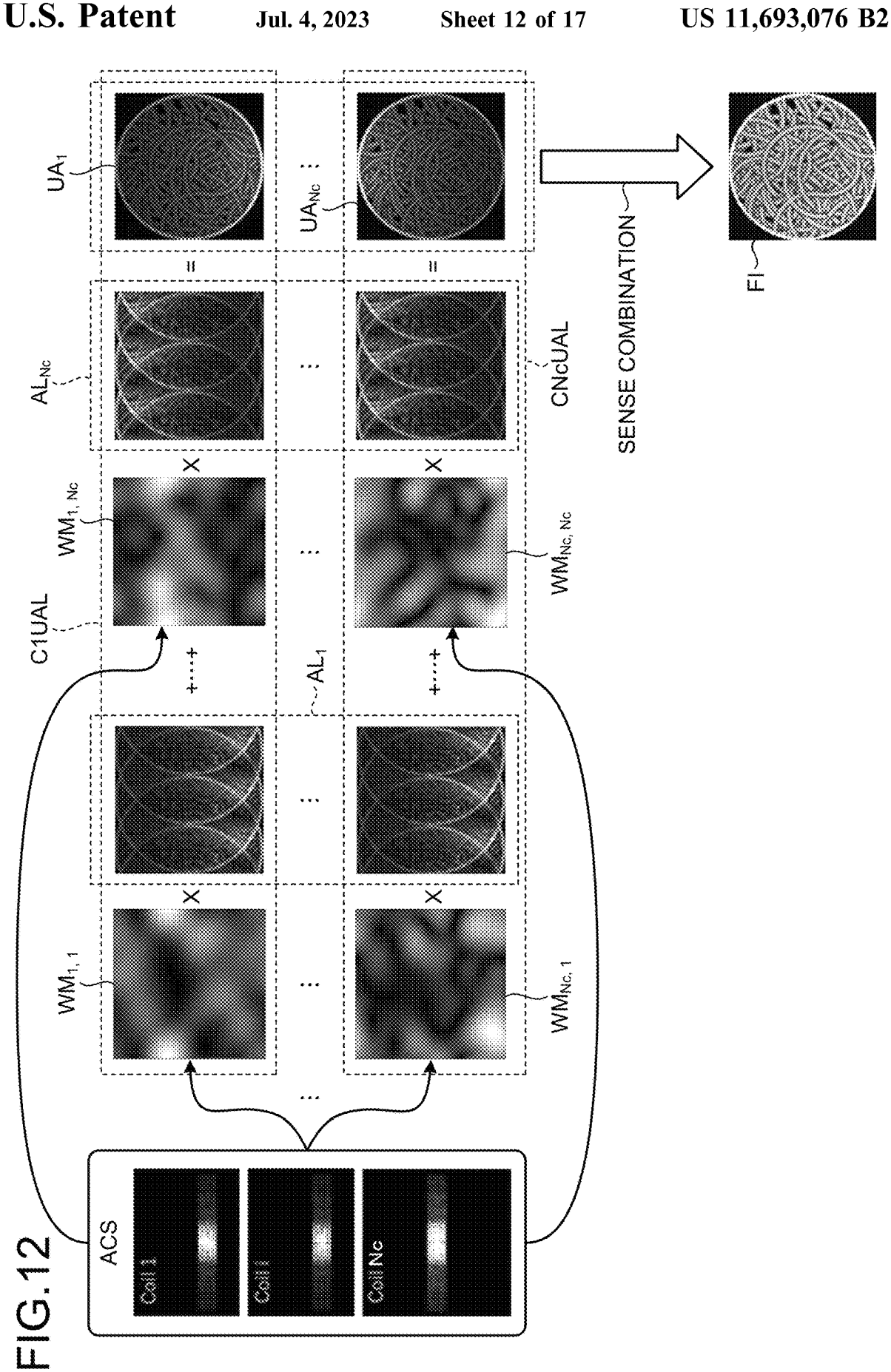
FIG. 12 is a drawing according to the embodiment illustrating an outline of a main scan image generating process performed by a generating function.

Step S523:

By employing the generating function 155, the processing circuitry 15 generates an MR image (a main scan image) corresponding to the thin-out acquisition, i.e., the first parallel imaging process, on the basis of the plurality of weight maps, the plurality of aliasing images, and the plurality of sensitivity maps. FIG. 12 illustrates an outline related to the process of generating a main scan image FI, i.e., the MR image related to the first parallel imaging process, performed by the generating function 155.

As illustrated in FIG. 12, a plurality of (Nc) aliasing images (AL$_1$, ..., AL$_{Nc}$) corresponding to the plurality of reception coils are generated by performing a Fourier transform based on the first MR data related to each of the plurality of reception coils. As illustrated in FIG. 12, a plurality of (the square of Nc) weight maps (WM$_{1,1}$, ... WM$_{1,Nc}$, ..., WM$_{Nc,Nc}$) are generated on the basis of the ACS in the first MR data related to each of the plurality of reception coils and are respectively multiplied by the plurality of (Nc) aliasing images (AL$_1$, ..., AL$_{Nc}$) in the image space.

The process "C1UAL" (hereinafter, "first coil unfolding process") in the top line of FIG. 12 indicates an example of an aliasing unfolding process performed on the aliasing image AL$_1$ related to the first reception coil (Coil 1). The weight map WM$_{1,1}$ is a map indicating the weights applied to the image space related to the first reception coil, with respect to the aliasing image AL$_1$ corresponding to the first reception coil. The weight map WM$_{1,Nc}$ is a map indicating the weights applied to the image space related to the first reception coil, with respect to the aliasing image AL$_{Nc}$ corresponding to the Nc-th reception coil. The image UA$_1$ generated by the first coil unfolding process C1UAL corresponds to an image (hereinafter, "first unfolded image") obtained by unfolding the aliasing in the aliasing image AL$_1$ related to the first reception coil (Coil 1).

It is possible to express the calculation performed in the image space as the first coil unfolding process C1UAL illustrated in FIG. 12, by using the expression presented below:

$$UA_1 = \sum_{i=1}^{Nc} WM_{1,i} AL_i$$

Further, the process "CNcUAL" (hereinafter, "Nc-th coil unfolding process") in the bottom line of FIG. 12 indicates an example of an aliasing unfolding process performed on the aliasing image AL$_{Nc}$ related to the Nc-th reception coil (Coil Nc). The weight map WM$_{Nc,1}$ is a map indicating the weights applied to the image space related to the Nc-th reception coil, with respect to the aliasing image AL$_1$ corresponding to the first reception coil. The weight map WM$_{Nc,Nc}$ is a map indicating the weights applied to the image space related to the Nc-th reception coil, with respect to the aliasing image AL$_{Nc}$ corresponding to the Nc-th reception coil. The image UA$_{Nc}$ generated by the Nc-th coil unfolding process CNcUAL corresponds to an image (hereinafter, "Nc-th unfolded image") obtained by unfolding the aliasing in the aliasing image AL$_{Nc}$ related to the Nc-th reception coil (Coil Nc). It is possible to express the calculation performed in the image space as the Nc-th coil unfolding process CNcUAL illustrated in FIG. 12, by using the expression presented below:

$$UA_{Nc} = \sum_{i=1}^{Nc} WM_{Nc,i} Al_i$$

When being generalized, the weight map $WM_{i,j}$ is a map indicating the weights applied to the image space related to the j-th reception coil, with respect to the aliasing image $AL_j$ corresponding to the i-th reception coil. In this situation, it is possible to express the calculation performed in the image space for generating an i-th unfolded image $UA_i$ calculated by the i-th coil unfolding process, by using the expression presented below:

$$UA_i = \sum_{j=1}^{Nc} WM_{i,j} AL_j$$

By implementing the above expression on all the reception coils, the generating function 155 generates Nc unfolded images corresponding to all the reception coils (of which the quantity is Nc). After that, the generating function 155 generates the main scan image by performing a SENSE combining process that uses the Nc unfolded images and Nc sensitivity maps. The SENSE combining process is to multiply the unfolded images corresponding to the reception coils by the sensitivity maps and to add together the multiplication results with respect to all the reception coils. Because it is possible to apply an existing technique to the SENSE combining process, detailed explanations thereof will be omitted. As a result, the generating function 155 generates, as illustrated in FIG. 12, the MR image (the main scan image) related to the first parallel imaging process, by using the first MR data and the weights related to the adjusted first g factors. As illustrated in FIG. 12, the process of generating the main scan image in the present embodiment is different from image generating processes based on GRAPPA and from image generating processes based on SENSE.

Alternatively, the generating function 155 may generate the main scan image by calculating the square root of a sum of squares (hereinafter, "SOS") with respect to the plurality of reception coils by using the Nc unfolded images. Because it is possible to apply an existing technique to the SOS scheme, detailed explanations thereof will be omitted. The main scan image FI generated by the generating function 155 is stored into the memory 11. The main scan image FI is displayed on the display device 127 according to a user instruction received via the input interface 125.

When the information processing apparatus 1 is not installed in the MRI apparatus 100, the generating function 155 outputs, via the communication interface 13, the generated main scan image to the medical image diagnosis apparatus related to MRI, a server in the PACS, a server in the HIS, or the like.

The information processing apparatus 1 according to the embodiment described above is configured to obtain: the first g factors generated by using the first MR data acquired through the first parallel imaging process performed by using the plurality of reception coils; and the second g factors generated by using the second MR data related to the second parallel imaging process performed by using the plurality of reception coils, and is further configured to adjust the first g factors so as to reduce the differences between the first g factors and the second g factors. For example, the information processing apparatus 1 adjusts the first g factors, by changing the regularization parameter used in the process of generating the first g factors from the first MR data. The information processing apparatus 1 is configured to adjust the first g factors, with respect to each of the plurality of reception coils.

More specifically, the information processing apparatus 1 according to the present embodiment is configured to adjust the first g factors so as to reduce the differences between (i) the plurality of first g factors included in the first region RE1 having the g factor values are equal to or larger than the threshold value within the first g map indicating the distribution of the values of the first g factors and (ii) the plurality of second g factors included in the second region RE2 corresponding to the first region RE1 within the second g map indicating the distribution of the values of the second g factors. For example, the information processing apparatus 1 is configured to adjust the first g factors so as to reduce the difference between the average value of the plurality of first g factors included in the first region RE1 and the average value of the plurality of second g factors included in the second region RE2. More specifically, the information processing apparatus 1 is configured to adjust the first g factors, by increasing the regularization parameter until the upper limited is reached, the regularization parameter being used in the process of generating the first g factors from the first MR data.

Figure 13:
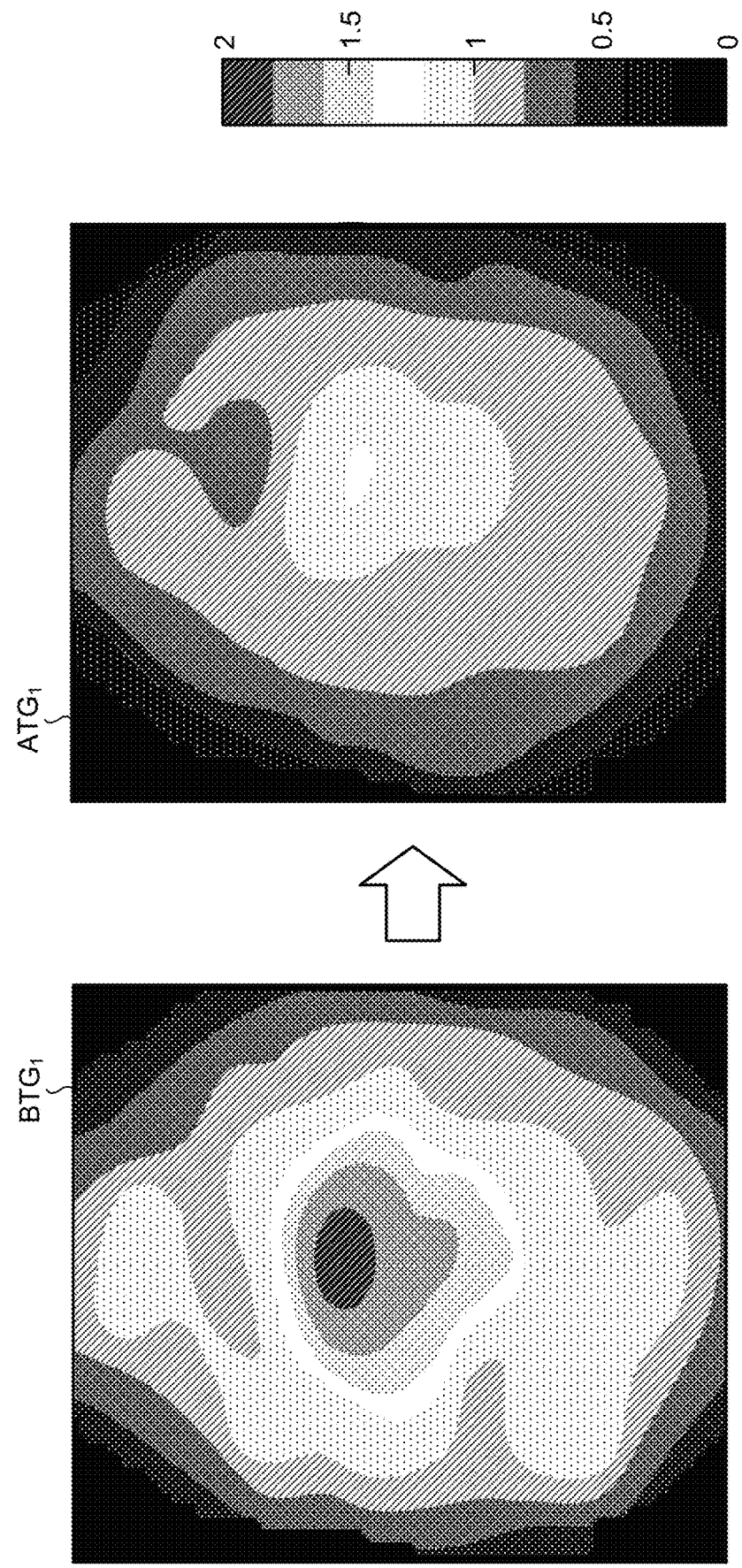
FIG. 13 is a drawing according to the embodiment illustrating examples of a first overall g map in an image space corresponding to a main scan image, before and after execution of a g factor adjusting process.

FIG. 13 is a drawing illustrating examples of a g map (hereinafter, "first overall g map") in the image space corresponding to the main scan image, before and after the execution of the g factor adjusting process. It is possible to calculate a first overall g map $TG_1$, by using the expression presented below which uses, for example, a weight map $WM_{j,j}$ expressed with complex numbers and the Hermitian conjugate $WM_{j,j}^H$ of the weight map $WM_{j,j}$.

$$TG_1 = \sqrt{\sum_{j=1}^{Nc} WM_{i,j}(WM_{i,j}^H)} \quad (5)$$

The first overall g map $BTG_1$ on the left side of FIG. 13 denotes a first overall g map before the g factor adjusting process. Further, the first overall g map $ATG_1$ on the right side of FIG. 13 denotes a first overall g map after the g factor adjusting process. As illustrated in FIG. 13, to each of the plurality of pixels in the first overall g map after the g factor adjusting process, a value of a g factor (hereinafter, "third g factor") is assigned. As illustrated in FIG. 13, after the g factor adjusting process is performed, the values of the g factors have been reduced.

FIG. 14 is a drawing illustrating an overall g map (hereinafter, "second overall g map") $TG_2$ related to the MR image generated by the second parallel imaging process and the first overall g map $ATG_1$ after the g factor adjusting process. As illustrated in FIG. 14, to each of the plurality of pixels in the second overall g map $TG_2$, a value of a g factor (hereinafter, "fourth g factor") is assigned. As illustrated in FIGS. 13 and 14, in the first overall g map $ATG_1$ after the g factor adjusting process, the g factors have been reduced to an extent approximately equal to those in the second overall g map $TG_2$.

Figure 15:
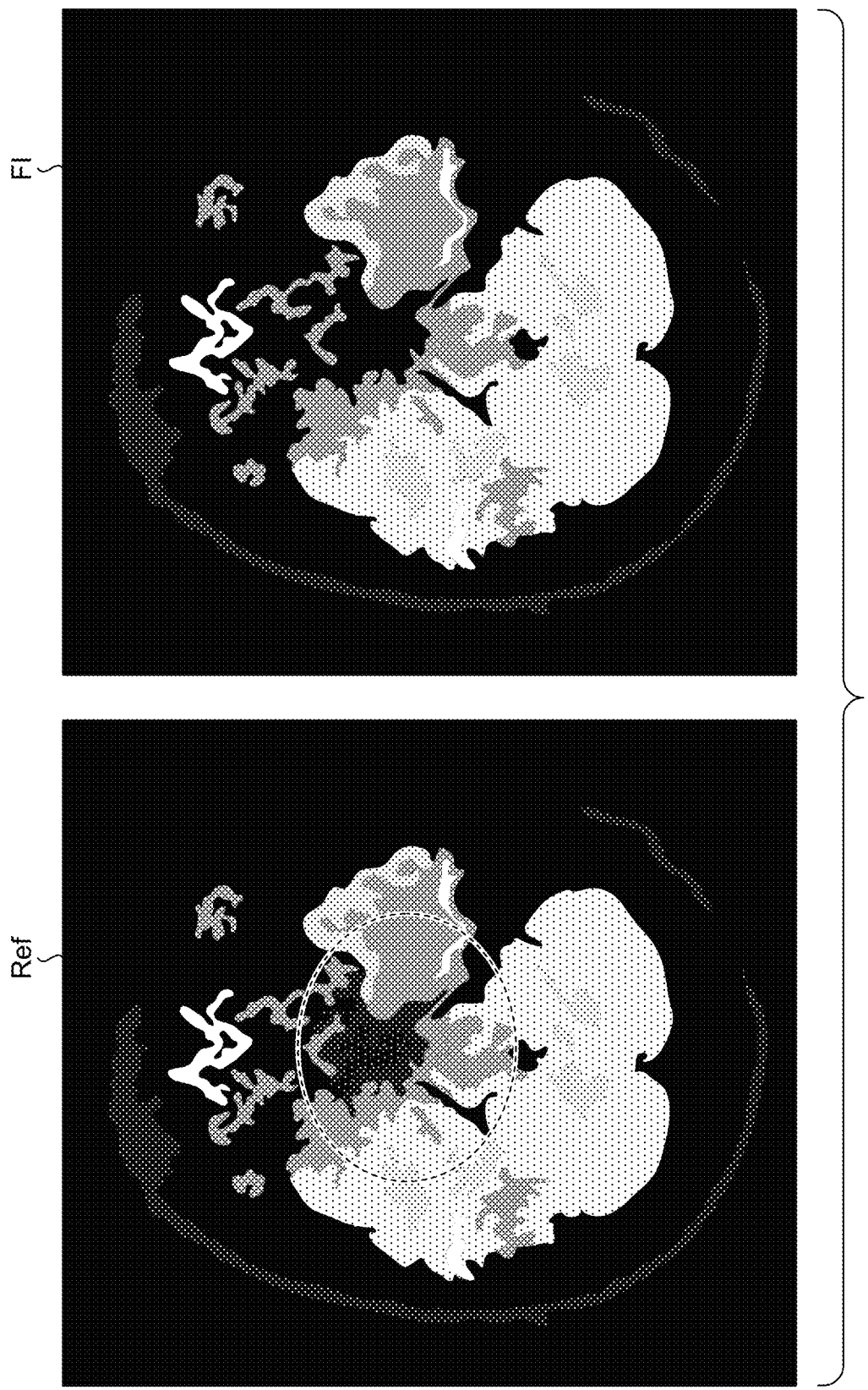
FIG. 15 is a drawing according to the embodiment illustrating examples of a main scan image serving as a comparison example on which the g factor adjusting process has not been performed and another main scan image generated while the first g factors are reduced by applying the g factor adjusting process.

FIG. 15 is a drawing illustrating examples of: an unadjusted MR image Ref serving as a comparison example which was generated by the first parallel imaging process and on which the g factor adjusting process has not been performed; and the main scan image FI generated while the first g factors are reduced by applying thereto the g factor adjusting process according to the present embodiment. As illustrated in FIG. 15, in the region enclosed by the dotted line in the main scan image FI generated by applying the g factor adjusting process according to the present embodiment, the Signal-to-Noise Ratio (SNR) is improved compared to that in the unadjusted MR image Ref serving as the comparison example.

As explained above, the information processing apparatus 1 according to the present embodiment is able to reduce the first g factors by changing the regularization parameters so as to make the first g factors closer to the second g factors and is thus able to improve the SNR in the main scan image FI.

First Modification Example

In the present modification example, after step S521 in FIG. 6, the first overall g map $TG_1$ and the second overall g map $TG_2$ are generated so that, on the basis of the third g factors in the first overall g map $TG_1$ and the fourth g factors in the second overall g map $TG_2$, the first g factors are adjusted so as to reduce the differences between the third g factors and the fourth g factors. In the following sections, regarding a g factor adjusting process in the present modification example, a procedure in the processes performed after step S521 in FIG. 6 will be explained with reference to FIG. 16.

Figure 16:
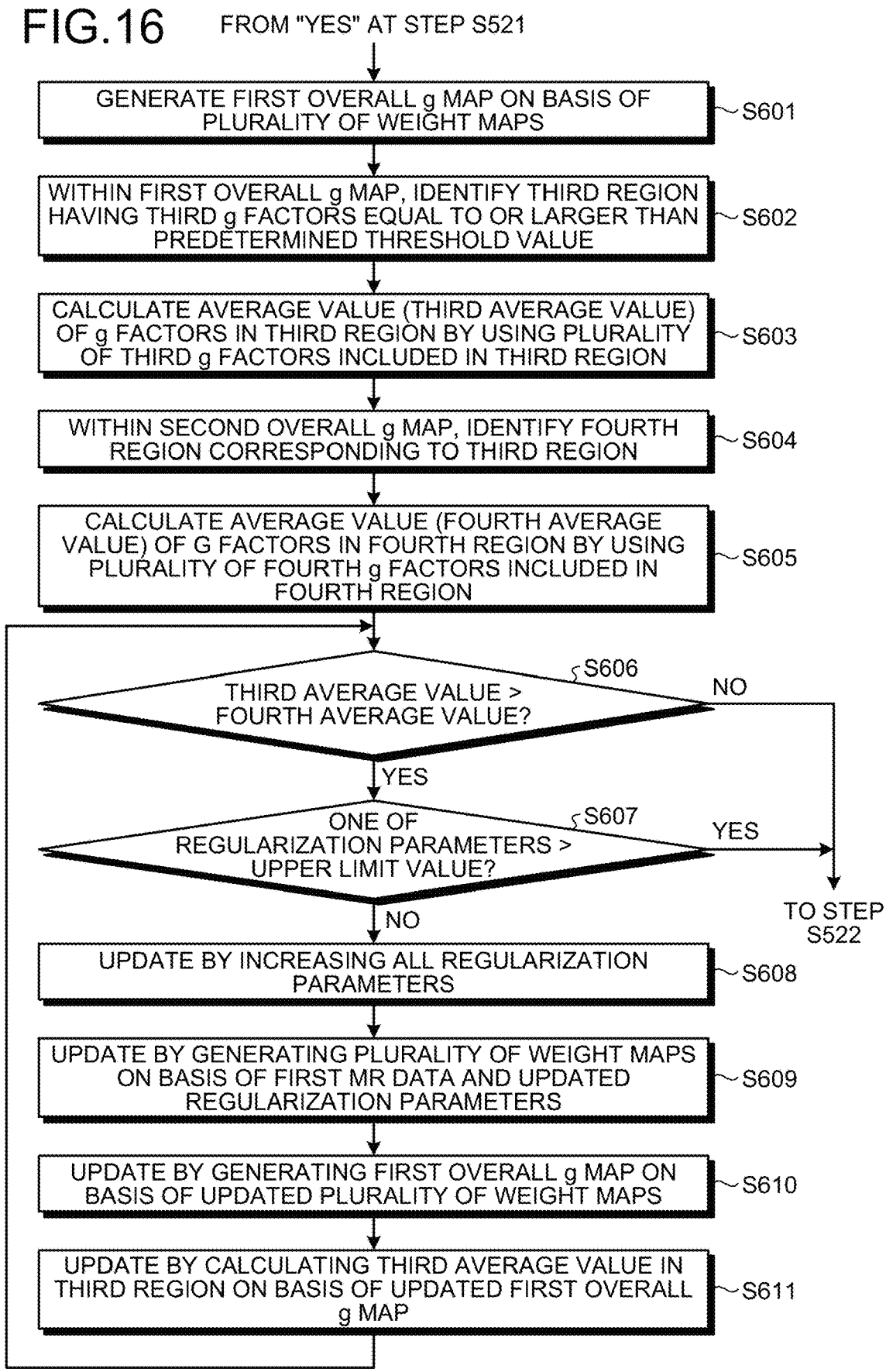
FIG. 16 is a flowchart illustrating an example of a procedure in a g factor adjusting process according to a first modification example of the embodiment.

FIG. 16 is a flowchart illustrating an example of a procedure in the g factor adjusting process according to the present modification example. As illustrated in FIG. 16, the g factor adjusting process in the present modification example is performed between step S521 and step S522 in the image generating process in FIG. 6.

Another g Factor Adjusting Process

Step S601:

The present step is performed subsequent to the judgment result "Yes" at step S521. By employing the adjusting function 153, the processing circuitry 15 generates the third g factors on the basis of the data from which the adjusted first g factors are derived, with respect to the image space corresponding to the main scan image generated through the first parallel imaging process. More specifically, the adjusting function 153 generates the first overall g map $TG_1$ having the third g factors in correspondence with the pixels, by performing the calculation in Expression (5) while using the plurality of weight maps.

Step S602:

By employing the adjusting function 153, the processing circuitry 15 identifies a third region having third g factors equal to or larger than a predetermined threshold value, within the first overall g map $TG_1$. Because the process related to identifying the third region is similar to the process at step S508 and corresponds to a process obtained by changing the processing target in the process at step S508 to the first overall g map $TG_1$, the explanations thereof will be omitted.

Step S603:

By employing the adjusting function 153, the processing circuitry 15 calculates an average value (hereinafter, "third average value") of the g factors in the third region, by using the plurality of third g factors included in the identified third region.

Step S604:

By employing the adjusting function 153, the processing circuitry 15 identifies a fourth region corresponding to the third region, within the second overall g map (the overall map described in step S502) $TG_2$. In other words, within the second overall g map $TG_2$, the adjusting function 153 identifies the same region as the first region, as the second region. When the information processing apparatus 1 is not installed in the MRI apparatus 100, the obtaining function 151 obtains the second overall g map $TG_2$ generated by the g map generating function 25, from the medical image diagnosis apparatus related to MRI, via the communication interface 13.

Further, when the information processing apparatus 1 in not installed in the MRI apparatus 100, the obtaining function 151 may obtain the plurality of sensitivity maps from the medical image diagnosis apparatus related to MRI via the communication interface 13. In that situation, the adjusting function 153 generates the second overall g map $TG_2$ on the basis of the obtained plurality of sensitivity maps. In an example, the adjusting function 153 may generate the second overall g map $TG_2$, by dividing the second g map corresponding to one reception coil, by the sensitivity map corresponding to the reception coil. After that, the adjusting function 153 identifies the fourth region within the generated second overall g map $TG_2$.

Step S605:

By employing the adjusting function 153, the processing circuitry 15 calculates an average value (hereinafter, "fourth average value") of the g factors in the fourth region, by using the plurality of fourth g factors included in the identified fourth region. The adjusting function 153 stores the fourth average value into the memory 11.

Step S606:

The processing circuitry 15 judges whether or not the third average value exceeds the fourth average value. When the third average value exceeds the fourth average value (step S606: Yes), the process at step S607 will be performed. On the contrary, when the third average value does not exceed the fourth average value (step S606: No), the process at step S522 will be performed. Alternatively, as the judging process at the present step, the adjusting function 153 may judge whether or not the third average value exceeds a value around the fourth average value.

Step S607:

By employing the adjusting function 153, the processing circuitry 15 judges whether or not one of the plurality of regularization parameters exceeds an upper limit value. When one of the plurality of regularization parameters exceeds the upper limit value (step S607: Yes), the process at step S522 will be performed. On the contrary, when the upper limit value is not exceeded (step S607: No), the process at step S608 will be performed. Alternatively, one or both the plurality of judging processes performed at steps S606 and S607 may be performed by a judging function separately provided in the processing circuitry 15.

Step S608:

By employing the adjusting function 153, the processing circuitry 15 increases all the regularization parameters. For example, the adjusting function 153 increases the regularization parameters by multiplying all the regularization parameters by the predetermined ratio "Ra" being one or larger. The adjusting function 153 stores the value ($\lambda_i \times Ra$) obtained by multiplying the regularization parameter $\lambda_i$ by the predetermined ratio "Ra" into the memory 11 as a new regularization parameter $\lambda_i$ related to the i-th reception coil, so as to be kept in association with the number i identifying the reception coil. Thus, all the regularization parameters have been updated.

Step S609:

By employing the adjusting function 153, the processing circuitry 15 generates a plurality of weight maps on the basis of the first MR data and the updated regularization parameters. The adjusting function 153 updates the plurality of weight maps, by storing the generated plurality of weight maps into the memory 11 so as to be kept in correspondence with the number identifying the reception coil. Because the process related to updating the weight maps using the updated regularization parameters is the same as the processes at steps S516 and S517, the explanations thereof will be omitted.

Step S610:

By employing the adjusting function 153, the processing circuitry 15 generates the first overall g map on the basis of the updated plurality of weight map. The adjusting function 153 updates the first overall g map by storing the generated first overall g map into the memory 11. Because the process of generating the first overall g map is the same as that at step S601, the explanations thereof will be omitted.

Step S611:

By employing the adjusting function 153, the processing circuitry 15 identifies the third region within the updated first overall g map, on the basis of the updated first overall g map. Subsequently, the adjusting function 153 calculates the third average value in the third region. The adjusting function 153 updates the third average value by storing the calculated third average value into the memory 11.

The information processing apparatus 1 according to the first modification example described above is configured, in the g factor adjusting process, to generate the third g factors on the basis of the data (the plurality of weight maps) from which the adjusted first g factors are derived, with respect to the image space corresponding to the MR image (the main scan image) generated through the first parallel imaging process, and is configured to generate, with respect to the image space, the fourth g factors on the basis of the data (the plurality of pieces of sensitivity data) from which the second g factors are derived, so as to further adjust the first g factors so as to reduce the differences between the third g factors and the fourth g factors.

More specifically, the information processing apparatus 1 according to the present modification example is configured to identify the third region within the first overall g map $TG_1$ having the generated third g factors and sets the same region as the third region within the second overall g map $TG_2$. Subsequently, when the third average value of the g factors in the third region exceeds the fourth average value of the g factors in the fourth region, the information processing apparatus 1 is configured to increase the regularization parameters by multiplying all the regularization parameters by the predetermined ratio. As a result, the information processing apparatus 1 according to the present modification example is able to reduce the first g factors by changing the regularization parameters so as to make the third g factors closer to the fourth g factors and is thus able to improve the SNR of the main scan image FI. Because the other advantageous effects of the present modification example are the same as those described in the embodiment, the explanations thereof will be omitted.

Application Example

In an application example of the first modification example, all the regularization parameters may be increased by multiplying all the regularization parameters by a predetermined ratio until one of the regularization parameters exceeds an upper limit value. When the one of the regularization parameters has exceeded the upper limit value, the regularization parameters that are smaller than the upper limit value are increased with respect to each of the reception coils.

Figure 17:
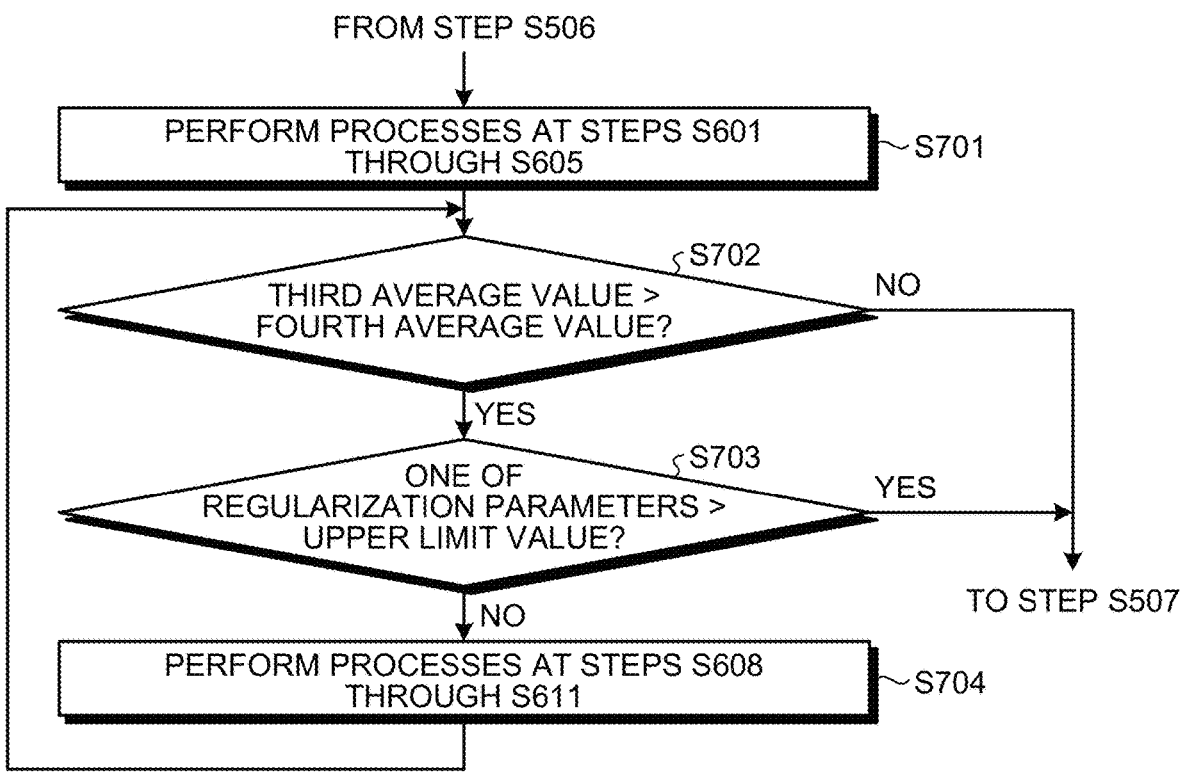
FIG. 17 is a flowchart according to an application example of the first modification example of the embodiment illustrating an example of a procedure in an image generating process.

FIG. 17 is a flowchart illustrating an example of a processing procedure in an image generating process according to the present application example. As illustrated in FIG. 17, in the image generating process, after step S506 in FIG. 5, the processes at steps S601 through S605 in FIG. 16 are performed (step S701). Subsequently, when the third average value exceeds the fourth average value (step S702: Yes), the process at step S703 will be performed. On the contrary, when the third average value does not exceed the fourth average value (step S702: No), the process at step S507 in FIG. 5 will be performed. Because the process at step S702 is the same as the process at step S606 in FIG. 16, the explanations thereof will be omitted.

When one of the regularization parameters exceeds the upper limit (step S703: Yes), the process at step S507 will be performed. On the contrary, when the upper limit value is not exceeded (step S703: No), the processes at steps S608 through S611 in FIG. 16 will be performed (step S704). Because the process at step S703 is the same as the process at step S607 in FIG. 16, the explanations thereof will be omitted.

Because the advantageous effects of the present application example are the same as the advantageous effects of the first modification example, the explanations thereof will be omitted.

Second Modification Example

In a second modification example, as a procedure in the image generating process performed by the generating function 155, an image generating process using GRAPPA is performed. The difference from FIG. 6 lies in the processes at step S522 and thereafter. After the judgement result "Yes" at step S521 in FIG. 6, the processing circuitry 15 generates, by employing the generating function 155, k-space data which corresponds to each of the plurality of reception coils and in which thinned-out data is interpolated, by applying each of the plurality of convolution kernels serving as the bases of the plurality of coil coefficient maps to the first MR data.

Subsequently, the generating function 155 generates a plurality of MR images (hereinafter, "coil correspondence images") respectively corresponding to the plurality of reception coils, by performing a Fourier transform on the k-space data. The generating function 155 generates a main scan image by combining together the plurality of coil correspondence images. Because it is possible to apply an existing technique to the image generating process using GRAPPA, detailed explanations thereof will be omitted. Because the advantageous effects of the present modification example are the same as the advantageous effects of the embodiment, the explanations thereof will be omitted.

Third Modification Example

In a third modification example, a SENSE-related imaging process is performed as the first parallel imaging process. In this situation, a GRAPPA-related imaging process is performed as the second parallel imaging process. It is assumed that a pre-scan is performed in relation to generating the sensitivity maps. In that situation, with respect to the first parallel imaging process, the first g map is generated by using an existing method while being dependent on the regularization parameters. Further, the second g map is generated from the plurality of weight maps generated by using the regularization parameters determined through the GCV process. Because the processing procedure and the advantageous effects of the present modification example are similar to those of the embodiment, the explanations thereof will be omitted.

When the technical concepts of the present embodiment are realized as an information processing method, the information processing method includes: obtaining the first g factors generated by using the first MR data acquired through the first parallel imaging process performed by using the plurality of reception coils; and the second g factors generated by using the second MR data acquired through the second parallel imaging process performed by using the plurality of reception coils; and adjusting the first g factors so as to reduce the differences between the first g factors and the second g factors. Because the procedure and the advantageous effects of the image generating process related to the present information processing method are the same as those described in the embodiment, the explanations thereof will be omitted.

When the technical concepts of the present embodiment are realized as an information processing program (information processing computer program), the information processing program is configured to cause a computer to execute: obtaining the first g factors generated by using the first MR data acquired through the first parallel imaging process performed by using the plurality of reception coils; and the second g factors generated by using the second MR data acquired through the second parallel imaging process performed by using the plurality of reception coils; and adjusting the first g factors so as to reduce the differences between the first g factors and the second g factors.

For example, it is also possible to realize the g factor adjusting processes and the image generating processes, by installing the information processing program in a computer provided in a modality such as the MRI apparatus 100 or in a PACS server and loading the installed program into a memory. In that situation, it is also possible to distribute the program by storing the program into a storage medium such as a magnetic disk (e.g., a hard disk), an optical disk (e.g., a CD-ROM or a DVD), or a semiconductor memory, the program being capable of causing a computer to implement the method. Because the procedures and the advantageous effects of the g factor adjusting processes and the image generating processes implemented by the information processing program are the same as those of the present embodiments, the explanations thereof will be omitted.

According to at least one aspect of the embodiments and the like described above, it is possible to adjust the g factors so as to reduce the g factors. Accordingly, it is possible to reduce the g factors corresponding to the main scan image. It is therefore possible to generate the MR image having an improved SNR.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the scope of the invention as defined by the appended claims. The accompanying claims and their equivalents are intended to cover such forms or modifications as would fall within the scope of the invention as defined by the appended claims.

In relation to the above embodiments, the following notes are presented as certain aspects and optional characteristics of the present disclosure:

Note 1:

An information processing apparatus including:

an obtaining unit configured to obtain a first g factor generated by using first magnetic resonance data acquired through a first parallel imaging process performed by using a plurality of reception coils and a second g factor generated by using second magnetic resonance data related to a second parallel imaging process performed by using the plurality of reception coils, the second parallel imaging process being different from the first parallel imaging process; and an adjusting unit configured to adjust the first g factor so as to reduce a difference between the first g factor and the second g factor.

Note 2:

The first g factor is a factor indicating signal-to-noise ratio (SNR) related to the first parallel imaging process.

Note 3:

The second g factor is a factor indicating signal-to-noise ratio (SNR) related to the second parallel imaging process.

Note 4:

The adjusting unit may adjust the first g factor by changing a regularization parameter with which an impact is imposed on the first g factor by the first magnetic resonance data.

Note 5:

The regularization parameter may be used in a process of generating the first g factor from the first magnetic resonance data.

Note 6:

The information processing apparatus may be configured so that the smaller the regularization parameter is, the more noise is contained in a magnetic resonance image generated by using the first magnetic resonance data.

Note 7:

The adjusting unit may adjust the first g factor with respect to each of the plurality of reception coils.

Note 8:

The adjusting unit may adjust the first g factor so as to reduce a difference between (i) a plurality of first g factors included in a first region having g factor values equal to or larger than a threshold value within a first g map indicating a distribution of values of the first g factor and (ii) a plurality of second g factors included in a second region corresponding to the first region within a second g map indicating a distribution of values of the second g factor.

Note 9:

The adjusting unit does not execute comparison between (i) a plurality of first g factors included in a region having g factor values less than the threshold value within the first g map indicating the distribution of values of the first g factor and (ii) a plurality of second g factors included in a region corresponding to the region having the g factor values less than the threshold value within the second g map indicating the distribution of values of the second g factor.

Note 10:

The adjusting unit may adjust the first g factor so as to reduce the difference between a statistic value of the plurality of first g factors included in the first region and a statistic value of the plurality of second g factors included in the second region.

Note 11:
The adjusting unit may adjust the first g factor so as to reduce the difference between an average value of the plurality of first g factors included in the first region and an average value of the plurality of second g factors included in the second region.

Note 12:
The adjusting unit may adjust the first g factor by adjustment of a regularization parameter being used in a process of generating the first g factor from the first magnetic resonance data, and the adjustment of the regularization parameter may have an upper limit.

Note 13:
The adjusting unit may adjust the first g factor by increasing the regularization parameter until the upper limit is reached.

Note 14:
The information processing apparatus may further include: a generating unit configured to generate a magnetic resonance image related to the first parallel imaging process, by using the first magnetic resonance data and a weight related to the adjusted first g factor.

Note 15:
With respect to an image space corresponding to a magnetic resonance image generated through the first parallel imaging process, the adjusting unit may generate a third g factor on the basis of data from which the adjusted first g factor is derived, and with respect to the image space, the adjusting unit may generate a fourth g factor, on the basis of data from which the second g factor is derived, and the adjusting unit may adjust the first g factor so as to reduce a difference between the third g factor and the fourth g factor.

Note 16:
The first parallel imaging process may have an imaging protocol to acquire a magnetic resonance signal related to a trajectory corresponding to an auto-calibration signal in a k-space.

Note 17:
The second parallel imaging process may have an imaging protocol to acquire a magnetic resonance signal in which aliasing in an image in an image space is unfolded by using a plurality of sensitivity maps corresponding to the plurality of reception coils.

Note 18:
The first magnetic resonance data corresponding to each of the plurality of reception coils may include data related to the auto-calibration signal.

Note 19:
The second magnetic resonance data corresponding to each of the plurality of reception coils may include data used for generating a corresponding one of the plurality of sensitivity maps.

Note 20:
An information processing method including: obtaining a first g factor generated by using first magnetic resonance data acquired through a first parallel imaging process performed by using a plurality of reception coils and a second g factor generated by using second magnetic resonance data acquired through a second parallel imaging process performed by using the plurality of reception coils, the second parallel imaging process being different from the first parallel imaging process; and adjusting the first g factor so as to reduce a difference between the first g factor and the second g factor.

Note 21:
An information processing program configured to cause a computer to execute: obtaining a first g factor generated by using first magnetic resonance data acquired through a first parallel imaging process performed by using a plurality of reception coils and a second g factor generated by using second magnetic resonance data acquired through a second parallel imaging process performed by using the plurality of reception coils, the second parallel imaging process being different from the first parallel imaging process; and adjusting the first g factor so as to reduce a difference between the first g factor and the second g factor.

What is claimed is:

1. An information processing apparatus, comprising:
processing circuitry configured to
obtain a first g map generated using first magnetic resonance data acquired through a first parallel imaging process performed by using a plurality of reception coils and a second g map generated using second magnetic resonance data related to a second parallel imaging process performed by using the plurality of reception coils, the first g map indicating a spatial distribution of first g factors generated for a reception coil, the second g map indicating a spatial distribution of second g factors generated for a reception coil, the first g factors and the second g factors indicating a degree of amplification noise in an unfolding of the first and second parallel imaging processes,
wherein the first parallel imaging process has an imaging protocol to acquire a magnetic resonance signal related to a trajectory corresponding to an auto-calibration signal in a k-space,
the first magnetic resonance data corresponding to each of the plurality of reception coils includes data related to the auto-calibration signal,
the second parallel imaging process has an imaging protocol to acquire a magnetic resonance signal in which aliasing in an image in an image space is unfolded by using a plurality of sensitivity maps corresponding to the plurality of reception coils, and
the second magnetic resonance data corresponding to each of the plurality of reception coils includes data used for generating a corresponding one of the plurality of sensitivity maps;
adjust the plurality of first g factors so as to reduce a difference between the plurality of first g factors in a first region of the first g map and the plurality of second g factors, within a region of the second g map corresponding to the first region, by changing a regularization parameter with which an impact is imposed on the plurality of first g factors by the first magnetic resonance data; and
generate a magnetic resonance image related to the first parallel imaging process, by using the first magnetic resonance data and the adjusted plurality of first g factors.

2. An information processing method, comprising:
obtaining a first g map generated using first magnetic resonance data acquired through a first parallel imaging process performed by using a plurality of reception coils and a second g map generated using second magnetic resonance data acquired through a second parallel imaging process performed by using the plurality of reception coils, the first g map indicating a spatial distribution of first g factors generated for a reception coil, the second g map indicating a spatial distribution of second g factors generated for a reception coil, the first g factors and the second g factors indicating a degree of amplification noise in an unfolding of the first and second parallel imaging processes,
wherein the first parallel imaging process has an imaging protocol to acquire a magnetic resonance signal related to a trajectory corresponding to an auto-calibration signal in a k space,
the first magnetic resonance data corresponding to each of the plurality of reception coils includes data related to the auto-calibration signal,
the second parallel imaging process has an imaging protocol to acquire a magnetic resonance signal in which aliasing in an image in an image space is unfolded by using a plurality of sensitivity maps corresponding to the plurality of reception coils, and
the second magnetic resonance data corresponding to each of the plurality of reception coils includes data used for generating a corresponding one of the plurality of sensitivity maps;
adjusting the plurality of first g factors so as to reduce a difference between the plurality of first g factors in a first region of the first g map and the plurality of second g factors within a region of the second g map corresponding to the first region, by changing a regularization parameter with which an impact is imposed on the plurality of first g factors by the magnetic resonance data; and
generating a magnetic resonance image related to the first parallel imaging process, by using the first magnetic resonance date and the adjusted plurality of first g factors.

3. The information processing apparatus according to claim 1, wherein the processing circuitry is further configured to use the regularization parameter in a process of generating the first g map from the first magnetic resonance data.

4. The information processing apparatus according to claim 1, wherein the processing circuitry is further configured to adjust the first g map with respect to each of the plurality of reception coils.

5. The information processing apparatus according to claim 4, wherein the processing circuitry is further configured to adjust the plurality of first g factors so as to reduce a difference between:
(i) a plurality of first g factors included in a first region having g factor values equal to or larger than a threshold value within the first g map; and
(ii) a plurality of second g factors included in a region within the second g map corresponding to the first region.

6. The information processing apparatus according to claim 5, wherein the processing circuitry is further configured to not execute comparison between:
(i) a plurality of first g factors included in a region having g factor values less than the threshold value within the first g map; and
(ii) a plurality of second g factors included in a region corresponding to the region having the g factor values less than the threshold value within the second g map.

7. The information processing apparatus according to claim 5, wherein the processing circuitry is further configured to adjust the plurality of first g factors so as to reduce a difference between an average value of the plurality of first g factors included in the first region and an average value of the plurality of second g factors included in the region within the second g map corresponding to the first region.

8. The information processing apparatus according to claim 1, wherein
the processing circuitry is further configured to adjust the first g map by adjustment of the regularization parameter being used in a process of generating the first g map from the first magnetic resonance data, and
the adjustment of the regularization parameter has an upper limit.

9. The information processing apparatus according to claim 8, wherein the processing circuitry is further configured to adjust the first g map by increasing the regularization parameter until the upper limit is reached.

10. The information processing apparatus according to claim 1, wherein
with respect to an image space corresponding to a magnetic resonance image generated through the first parallel imaging process, the processing circuitry is further configured to generate a third g map based on a data from which the adjusted first g factor map is derived,
with respect to the image space, the processing circuitry is further configured to generate a fourth g map, based on a data from which the second g map is derived, and
the processing circuitry is further configured to adjust the first g map so as to reduce a difference between the third g map and the fourth g map.

11. A non-transitory computer-readable storage medium storing an information processing program configured to cause a computer to perform the information processing method of claim 2.

* * * * *